(12) United States Patent
Yazawa et al.

(10) Patent No.: US 8,043,042 B2
(45) Date of Patent: Oct. 25, 2011

(54) INDUSTRIAL ROBOT

(75) Inventors: Takayuki Yazawa, Nagano (JP);
Junnosuke Koyama, Nagano (JP)

(73) Assignee: Nidec Sankyo Corporation (JP)

( * ) Notice: Subject to any disclaimer, the term of this patent is extended or adjusted under 35 U.S.C. 154(b) by 557 days.

(21) Appl. No.: 12/133,684

(22) Filed: Jun. 5, 2008

(65) Prior Publication Data
US 2008/0304942 A1 Dec. 11, 2008

(30) Foreign Application Priority Data

Jun. 5, 2007 (JP) .................................. 2007-149267
Jun. 22, 2007 (JP) .................................. 2007-164948

(51) Int. Cl.
*B25J 15/00* (2006.01)
(52) U.S. Cl. ................ 414/744.5; 414/744.1; 294/103.1
(58) Field of Classification Search ............... 414/744.1, 414/744.5, 744.3; 294/103.1; 901/30, 31, 901/36
See application file for complete search history.

(56) References Cited

U.S. PATENT DOCUMENTS

| 6,514,033 | B2 * | 2/2003 | Sundar ....................... 414/744.5 |
| 6,682,113 | B2 * | 1/2004 | Cox et al. ..................... 294/104 |
| 6,685,422 | B2 * | 2/2004 | Sundar et al. ............... 414/744.5 |

FOREIGN PATENT DOCUMENTS

JP 2000-308988 11/2000

* cited by examiner

*Primary Examiner* — Donald Underwood
(74) *Attorney, Agent, or Firm* — Cantor Colburn LLP

(57) ABSTRACT

An industrial robot may include a robot hand structured to mount a transfer object, a multi-joint arm section having at least two arms including a robot hand supporting arm structured to support the robot hand to be rotatable; and a main section structured to support the multi-joint arm section to be rotatable. The robot hand may include a grasping part structured to contact and grasp the transfer object and a biasing member structured to bias the grasping part in a direction for grasping the transfer object. The robot hand supporting arm may include an eccentric member fixed to the robot hand supporting arm at a position being eccentric from a turning center of the robot hand in relation to the supporting arm.

7 Claims, 21 Drawing Sheets

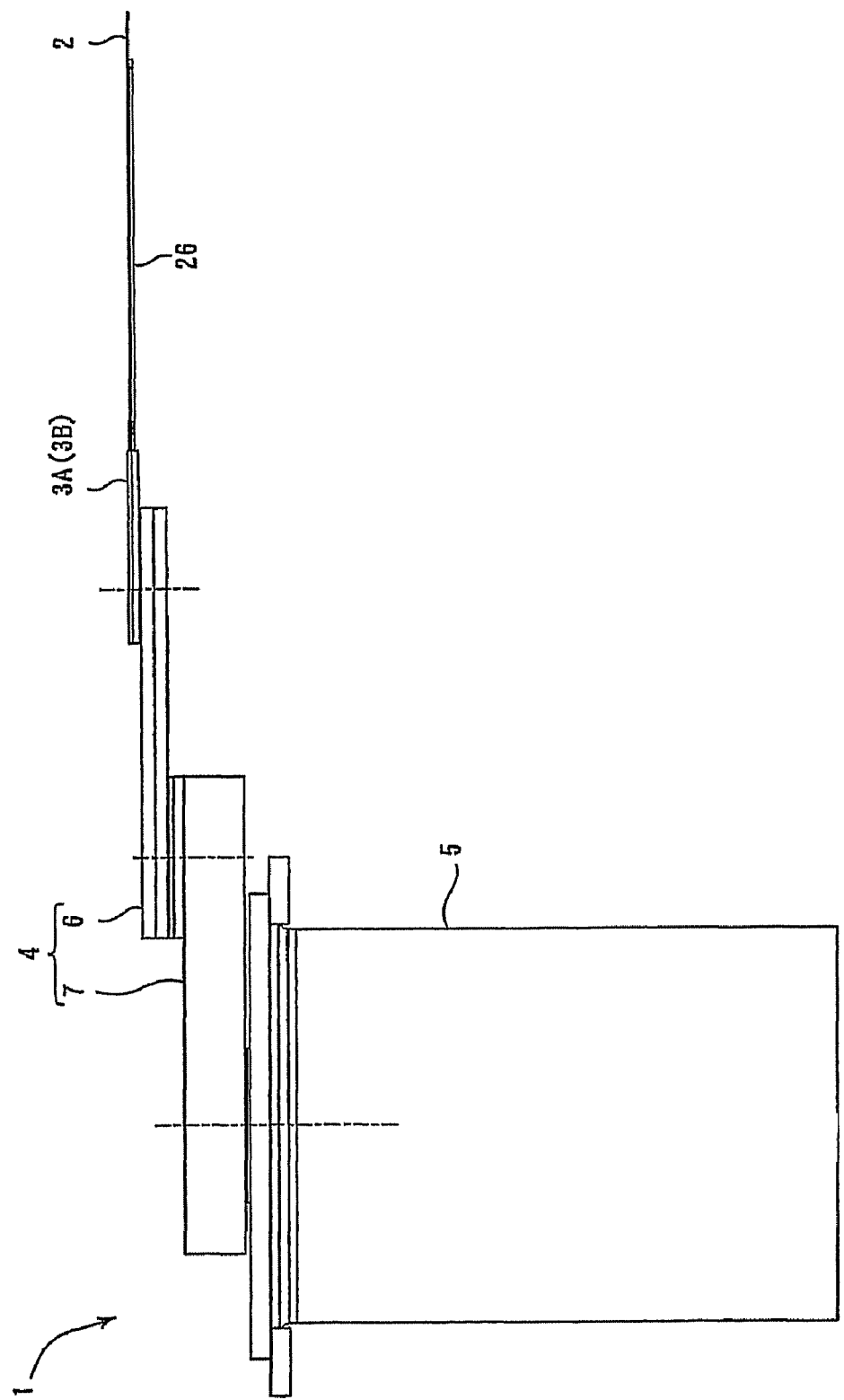

(B)

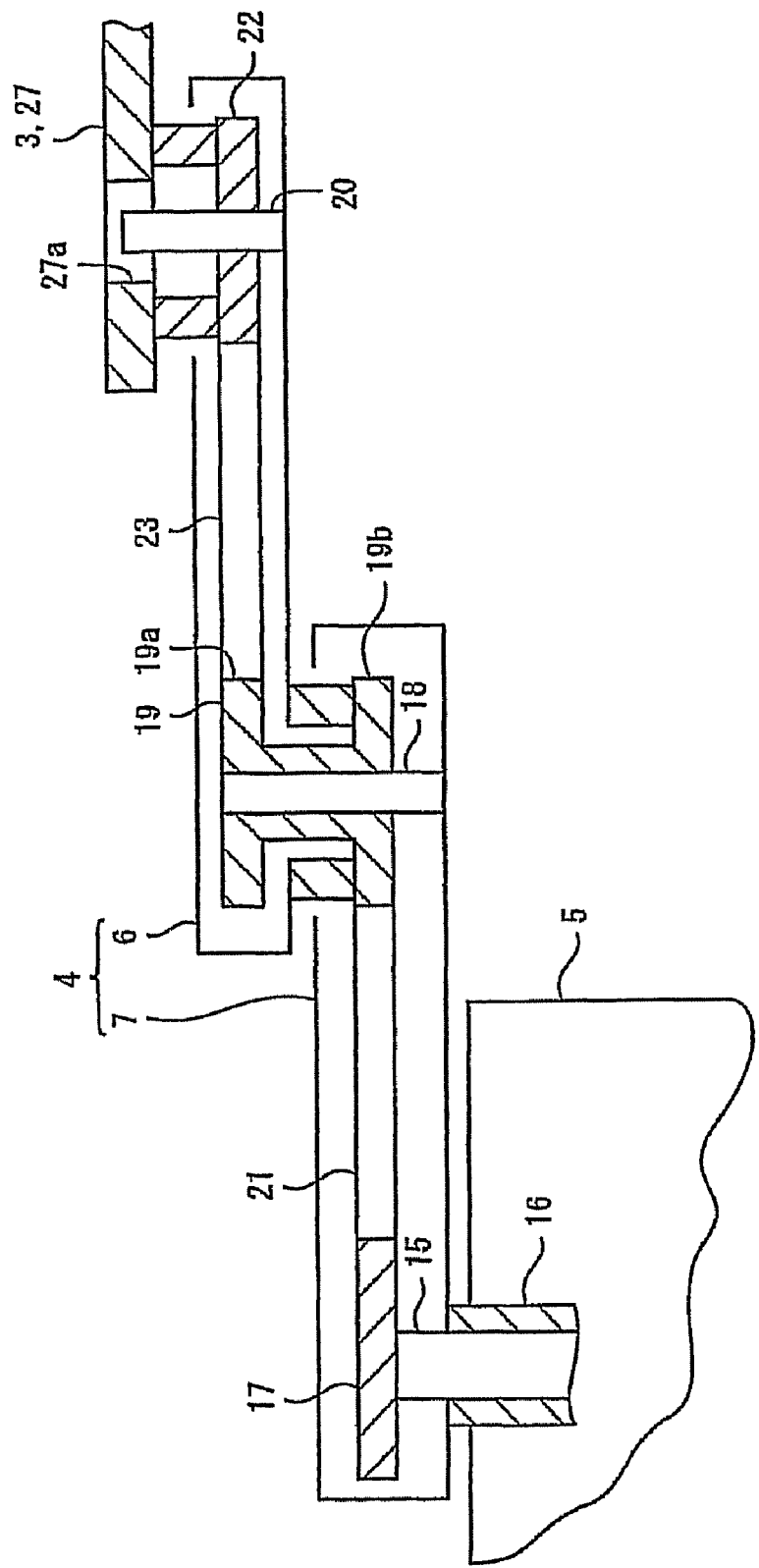

[Fig.7]
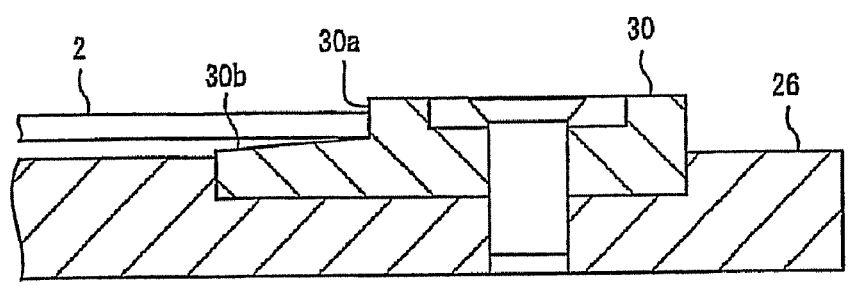
[Fig.8]
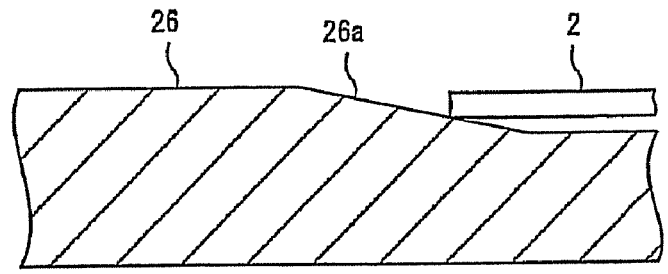

Fig. 10A
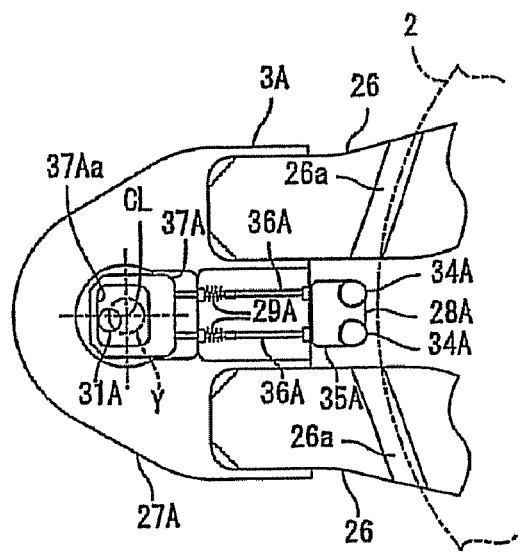
Fig. 10B
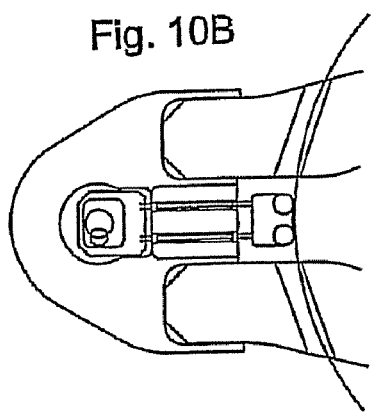 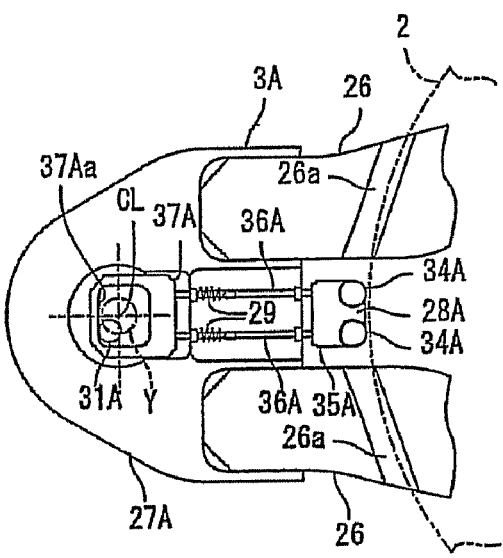
Fig. 10C
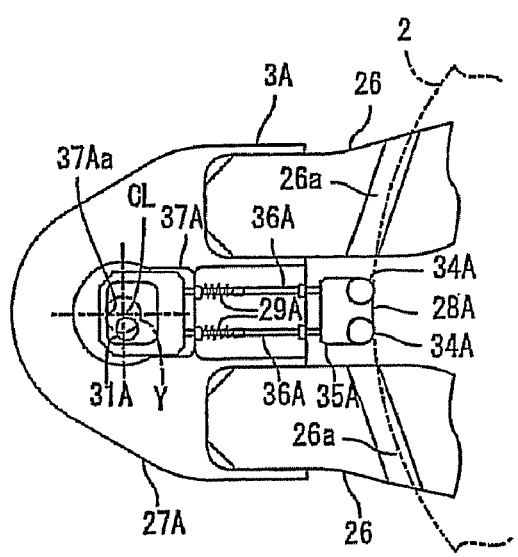

[Fig.11]
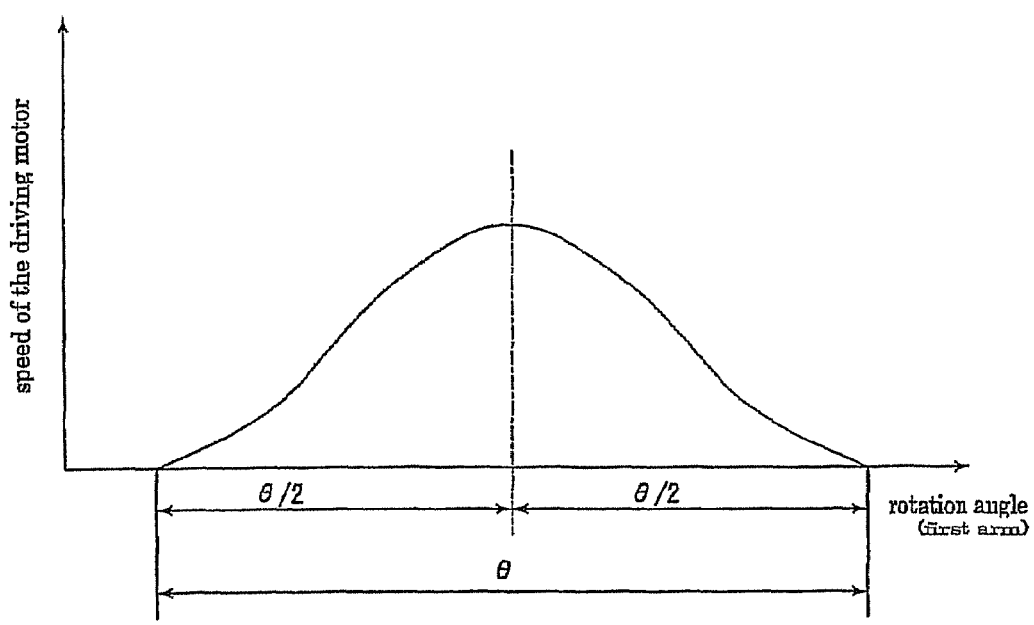

[Fig.12]
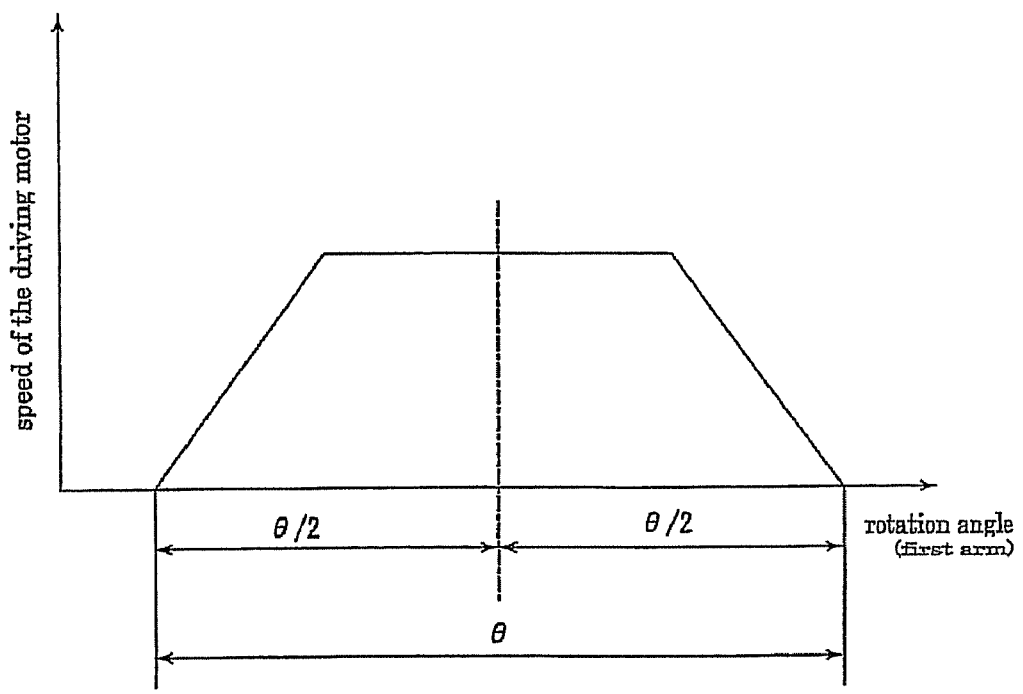

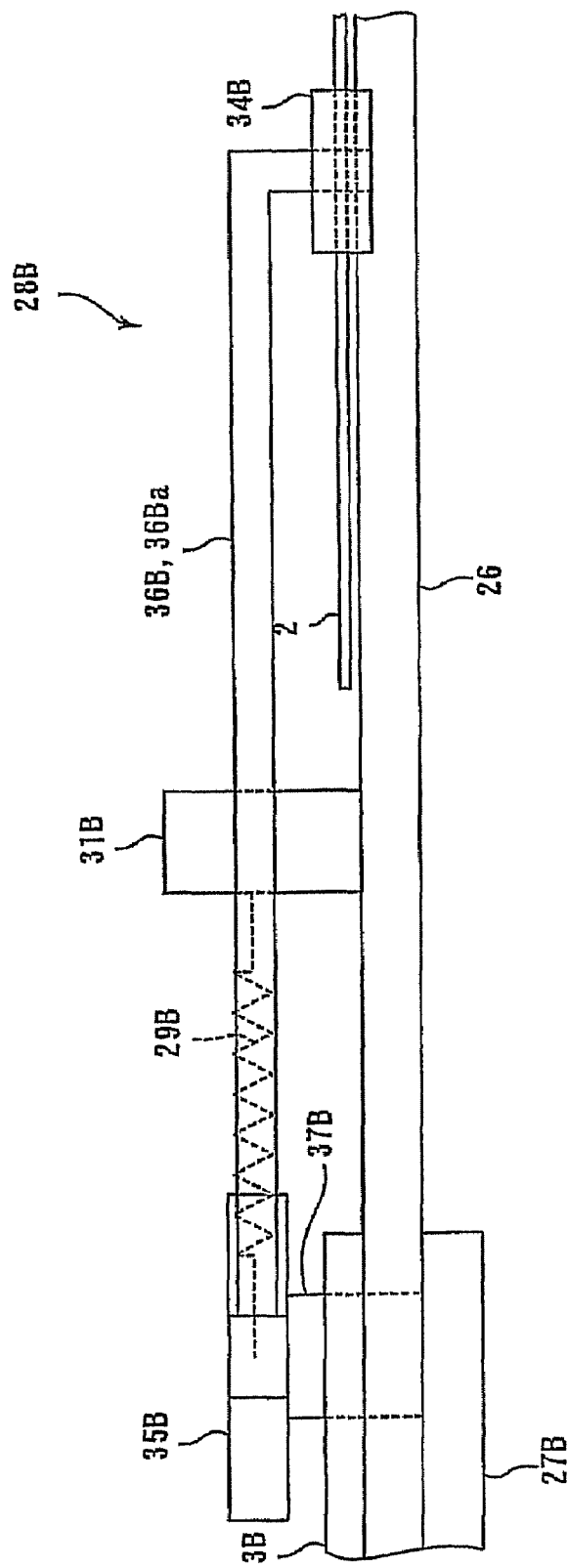

INDUSTRIAL ROBOT

CROSS REFERENCE TO RELATED APPLICATION

The present invention claims priority under 35 U.S.C. §119 to Japanese Application No. 2007-149267 filed Jun. 5, 2007 and Japanese Application No. 2007-164948 filed Jun. 22, 2007, both of which are incorporated herein by reference.

FIELD OF THE INVENTION

The present invention relates to an industrial robot that transfers a specific transfer object.

BACKGROUND

Conventionally, industrial robots have been used widely for purposes of taking out transfer objectives from a storage section, which stores the transfer objectives, as well as bringing transfer objectives into the storage section. Known as such industrial robots are those models that are used to take out semiconductor wafers, as transfer objectives, from a vacuum chamber, as a storage section; and meanwhile they also bring semiconductor wafers into the vacuum chamber (Refer to Patent Document 1).

An industrial robot described in Patent Document 1 is built in a semiconductor device manufacturing system. The industrial robot takes out a semiconductor wafer from a load lock chamber (a vacuum chamber), into which the semiconductor wafer is brought externally, and then brings the semiconductor wafer into a processing chamber (another vacuum chamber), where a prescribed processing operation is done on the semiconductor wafer. Meanwhile, the industrial robot is located in a transfer chamber (still another vacuum chamber) around which the load lock chamber and the processing chamber are placed.

In these years, industrial robots are requested to operate at high speed for transferring semiconductor wafers for improvement of productivity. Meanwhile, even in the transfer operation at high speed, it is necessary to grasp a semiconductor wafer surely on a robot hand, on which the semiconductor wafer is placed, so as not to dislocate the semiconductor wafer. Though an industrial robot operating in the atmosphere can commonly apply a method of grasping a semiconductor wafer by vacuum chucking, an industrial robot placed in a vacuum chamber cannot grasp a semiconductor wafer by vacuum chucking. Patent Document 1 proposes a clamping mechanism of a mechanical type for grasping a semiconductor wafer on a robot hand, as a method that satisfies the requirement from the transfer operation at high speed.

The clamping mechanism proposed by Patent Document 1 includes a lever mechanism that contacts the semiconductor wafer on the robot hand, and a working member for operating the lever mechanism mounted on a robot arm that supports the robot hand to keep the robot hand rotatable. Meanwhile the working member is placed at a position being eccentric from the turning center of the robot hand.

The lever mechanism is operated according to a relative turning operation between the robot arm and robot hand. The clamping mechanism proposed by Patent 1 enables grasping and releasing the semiconductor wafer by using the lever mechanism in this way.

[Patent Document 1]
Japanese Unexamined Patent Publication (Kokai) No. JP2000-308988

In these years, semiconductor devices are downsized and thin-profiled. According to downsizing and thin-profiling of the semiconductor devices, semiconductor wafers are also thin-profiled. However, the clamping mechanism for semiconductor wafers proposed by Patent Document 1 is not provided with sufficient consideration for clamping such a thin-profiled wafer. Therefore, the clamping mechanism for semiconductor wafers described in Patent Document 1 is in danger of making a physical impact against a semiconductor wafer when grasping the semiconductor wafer so as to eventually cause damage to the semiconductor wafer.

Furthermore, the clamping mechanism for semiconductor wafers proposed by Patent Document 1 operates the lever mechanism, through the relative turning operation between the robot arm and robot hand, by using the working member that is placed at the position being eccentric from the turning center of the robot hand so as to grasp and release the semiconductor wafer. Consequently, the mechanism for grasping and releasing the semiconductor wafer becomes complicated.

SUMMARY OF THE INVENTION

At least an embodiment of the present invention provides an industrial robot that can reduce a physical impact to be made upon a transfer object when the transfer object is grasped by mechanical construction.

At least an embodiment of the present invention provides an industrial robot that can grasp and release a transfer object by using simple construction.

At least an embodiment of the present invention may include: an industrial robot, for taking out a transfer object from a storage section where the transfer object is stored and bringing the transfer object into the storage section, including: a robot hand for mounting the transfer object; a multi-joint arm section having at least two arms including a robot hand supporting arm for supporting the robot hand to be rotatable at a top side, the multi-joint arm section expanding/folding at the time of taking out and bringing in the transfer object from/to the storage section; a main section for supporting the multi-joint arm section to be rotatable; wherein the robot hand includes: a grasping part for contacting and grasping the transfer object; and a biasing member for biasing the grasping part in a direction for grasping the transfer object; and the robot hand supporting arm includes: an eccentric member fixed to the robot hand supporting arm at a position being eccentric from a turning center of the robot hand in relation to the hand supporting arm, the eccentric member contacting the grasping part so as to evacuate the grasping part from the transfer object before starting operation of taking out the transfer object from the storage section; and the eccentric member moves in comparison with the grasping part according to the expanding/folding motion of the multi-joint arm section for taking out the transfer object from the storage section so as to have the grasping part move in a direction for grasping the transfer object; and the grasping part starts grasping the transfer object with a biasing force of the biasing member at the time of one of constant-speed operation and deceleration in the expanding/folding motion of the multi-joint arm section for taking out the transfer object from the storage section.

In the industrial robot according to at least an embodiment of the present invention, the eccentric member contacts the grasping part so as to evacuate the grasping part from the transfer object before starting operation of taking out the transfer object from the storage section, and the eccentric member moves in comparison with the grasping part according to the expanding/folding motion of the multi-joint arm section for taking out the transfer object from the storage section so as to have the grasping part move in a direction for grasping the transfer object. Furthermore, the grasping part starts grasping the transfer object with the biasing force of the biasing member at the time of one of constant-speed operation and deceleration in the expanding/folding motion of the multi-joint arm section for taking out the transfer object from the storage section.

Therefore, at the time of taking out the transfer object from the storage section, motion speed of the grasping part can be controlled by the eccentric member for a comparatively long time from starting the expanding/folding motion of the multi-joint arm section until the time of one of constant-speed operation and deceleration in the expanding/folding motion of the multi-joint arm section. Accordingly, the transfer object can be grasped by having the grasping part contact the transfer object relatively slowly in comparison with the clamping mechanism described in Patent Document 1. As a result, in the industrial robot according to at least an embodiment of the present invention; when the transfer object is grasped even with the mechanical construction by using the grasping part, the eccentric member, and the biasing member, the physical impact given onto the transfer object can be reduced.

In at least an embodiment of the present invention, it is preferable that the grasping part grasps the transfer object with the biasing force of the biasing member before starting operation of bringing the transfer object into the storage section; the eccentric member moves in comparison with the grasping part according to the expanding/folding motion of the multi-joint arm section for bringing the transfer object into the storage section so as to have the grasping part move in a direction for evacuating from the transfer object; and the grasping part furthermore starts evacuating from the transfer object at the time of one of constant-speed operation and deceleration in the expanding/folding motion of the multi-joint arm section for bringing the transfer object into the storage section. According to the configuration described above, the grasping part can be evacuated from the transfer object for a comparatively long time from the time of one of acceleration and constant-speed operation in the expanding/folding motion of the multi-joint arm section for bringing the transfer object into the storage section until the middle of the expanding/folding motion of the multi-joint arm section. Namely, the grasping part can be evacuated comparatively slowly. As a result, damage caused onto the components included in the grasping part can be reduced.

In at least an embodiment of the present invention, it is preferable that the grasping part is placed at a root side of the robot hand, which is a side of the robot hand supporting arm; and the robot hand includes contacting sections, which edges of the transfer object contact, at a top side of the robot hand. According to the configuration described above, even when grasping the transfer object starts with the biasing force of the biasing member at the time of one of constant-speed operation and deceleration in the expanding/folding motion of the multi-joint arm section for taking out the transfer object from the storage section, the contacting sections can prevent the transfer object from dislocation since the edges of the transfer object contact the contacting sections at the time of acceleration, etc. in the expanding/folding motion of the multi-joint arm section for taking out the transfer object from the storage section. Furthermore, even when evacuating the grasping part from the transfer object starts at the time of one of acceleration and constant-speed operation in the expanding/folding motion of the multi-joint arm section for bringing the transfer object into the storage section, the contacting sections can prevent the transfer object from dislocation since the edges of the transfer object contact the contacting sections at the time of deceleration, etc. in the expanding/folding motion of the multi-joint arm section for bringing the transfer object into the storage section.

In at least an embodiment of the present invention, it is preferable that the grasping part includes a rotatable roller that contacts the transfer object. According to the configuration described above, even if the transfer object is dislocated on the robot hand when the grasping part contacts the transfer object, the transfer object can be guided rightly to a prescribed position without causing any damage onto the transfer object.

In at least an embodiment of the present invention, it is preferable that the grasping part moves linearly in directions of grasping the transfer object and evacuating from the transfer object. According to the configuration described above, it becomes possible to make the installation space for the grasping part narrower and to ensure downsizing and thin-profiling design of the robot hand.

In at least an embodiment of the present invention, it is preferable that the grasping part includes at least two shafts being guided linearly in the directions of grasping the transfer object and evacuating from the transfer object. According to the configuration described above, the two shafts prevent the grasping part from rotation with the moving direction of the grasping part as a rotation center.

In at least an embodiment of the present invention, it is preferable that the grasping part includes a cylindrical cam part, in which formed on an internal surface is a cam surface that the eccentric member contacts. According to the configuration described above, a simple structure including the eccentric member and the cam part enables the grasping part to move linearly in the grasping direction to the transfer object as well as the evacuating direction from the transfer object.

To achieve the object described above, provided furthermore by at least an embodiment of the present invention is: an industrial robot, for taking out a transfer object from a storage section where the transfer object is stored and bringing the transfer object into the storage section, including: a robot hand for mounting the transfer object; a multi-joint arm section having at least two arms including a robot hand supporting arm for supporting the robot hand to be rotatable at a top side, the multi-joint arm section expanding/folding at the time of taking out and bringing in the transfer object from/to the storage section; a main section for supporting the multi-joint arm section to be rotatable; wherein the robot hand includes: a grasping part for contacting and grasping the transfer object; and a biasing member for biasing the grasping part in a direction for grasping the transfer object; and the robot hand supporting arm includes: an eccentric member fixed to the robot hand supporting arm at a position being eccentric from a turning center of the robot hand in relation to the hand supporting arm, the eccentric member being able to contact the grasping part; and the eccentric member moves in comparison with the grasping part according to the expanding/folding motion of the multi-joint arm section for taking out the transfer object from the storage section so as to have the grasping part move in a direction for grasping the transfer object; and the grasping part is evacuated from the transfer object before starting operation of taking out the transfer object from the storage section, and the grasping part starts grasping the transfer object with the eccentric member, which contacts the grasping part, at the time of one of constant-speed operation and deceleration in the expanding/folding motion of the multi-joint arm section for taking out the transfer object from the storage section.

In the industrial robot according to at least an embodiment of the present invention, the eccentric member moves in comparison with the grasping part according to the expanding/folding motion of the multi-joint arm section for taking out the transfer object from the storage section so as to have the grasping part move in a direction for grasping the transfer object. Furthermore, the grasping part is evacuated from the transfer object before starting operation of taking out the transfer object from the storage section, and the grasping part starts grasping the transfer object with the eccentric member, which contacts the grasping part, at the time of one of constant-speed operation and deceleration in the expanding/folding motion of the multi-joint arm section for taking out the transfer object from the storage section.

Therefore, at the time of taking out the transfer object from the storage section, motion speed of the grasping part can be controlled by the eccentric member for a comparatively long time from starting the expanding/folding motion of the multi-joint arm section until the time of one of constant-speed operation and deceleration in the expanding/folding motion of the multi-joint arm section. Accordingly, the transfer object can be grasped by having the grasping part contact the transfer object relatively slowly in comparison with the clamping mechanism described in Patent Document 1. As a result, in the industrial robot according to at least an embodiment of the present invention; when the transfer object is grasped even with the mechanical construction by using the grasping part, the eccentric member, and the biasing member, the physical impact given onto the wafer 2 can be reduced.

To achieve the object described above, provided by at least an embodiment of the present invention is: an industrial robot, for taking out a transfer object from a storage section where the transfer object is stored and bringing the transfer object into the storage section, including: a robot hand for mounting the transfer object; a multi-joint arm section having at least two arms including a robot hand supporting arm for supporting the robot hand to be rotatable at a top side, the multi-joint arm section expanding/folding at the time of taking out and bringing in the transfer object from/to the storage section; a main section for supporting the multi-joint arm section to be rotatable; wherein the robot hand includes: a grasping part for contacting and grasping the transfer object; and a biasing member for biasing the grasping part in a direction for evacuating from the transfer object; and the grasping part includes: a grasping member that can contact the transfer object; and a weight component that moves the grasping member in a direction for the grasping member to contact the transfer object by an inertia force accompanying the expanding/folding motion of the multi-joint arm section.

In the industrial robot according to at least an embodiment of the present invention, the robot hand includes: a grasping part for contacting and grasping the transfer object; and a biasing member for biasing the grasping part in a direction for evacuating from the transfer object. Furthermore, the grasping part includes: a grasping member that can contact the transfer object; and a weight component that moves the grasping member in a direction for the grasping member to contact the transfer object by an inertia force accompanying the expanding/folding motion of the multi-joint arm section. Therefore, the transfer object can be grasped by a simple construction including grasping member and the weight component, and it can also be released by a simple construction including the biasing member.

In at least an embodiment of the present invention, it is preferable that the grasping part is placed at a root side of the robot hand, which is a side of the robot hand supporting arm; the robot hand includes contacting sections, which edges of the transfer object contact, at a top side of the robot hand; and the weight component moves the grasping member in a direction for the grasping member to contact the transfer object at the time of deceleration in the expanding/folding motion of the multi-joint arm section for taking out the transfer object from the storage section. According to the configuration described above, at the time of deceleration in the expanding/folding motion of the multi-joint arm section for taking out the transfer object from the storage section, the grasping member can prevent the transfer object from dislocation. Meanwhile, at the time of acceleration or constant-speed operation in the expanding/folding motion of the multi-joint arm section for taking out the transfer object from the storage section, the edges of the transfer object contact the contacting sections so that the contacting sections can prevent the transfer object from dislocation.

In at least an embodiment of the present invention, it is preferable that the grasping part is placed at a root side of the robot hand, which is a side of the robot hand supporting arm; the robot hand includes the contacting sections, which the edges of the transfer object contact, at the top side of the robot hand; and the weight component moves the grasping member in a direction for the grasping member to contact the transfer object at the time of acceleration in the expanding/folding motion of the multi-joint arm section for bringing the transfer object into the storage section. According to the configuration described above, at the time of acceleration in the expanding/folding motion of the multi-joint arm section for bringing the transfer object into the storage section, the grasping member can prevent the transfer object from dislocation. Meanwhile, at the time of deceleration in the expanding/folding motion of the multi-joint arm section for bringing the transfer object into the storage section, the edges of the transfer object contact the contacting sections so that the contacting sections can prevent the transfer object from dislocation.

In at least an embodiment of the present invention, it is preferable that the robot hand includes a restriction member that controls the motion of the grasping part in a biasing direction by the biasing member. According to the configuration described above, the position of the weight component can be controlled under a condition where the grasping member is evacuated. Consequently, by making use of the inertia force accompanying the expanding/folding motion of the multi-joint arm section, it becomes possible to have the grasping member contact the transfer object for sure.

In at least an embodiment of the present invention, it is preferable that the grasping part includes a lever, being rotatable and almost L-shaped, that connects the grasping member and the weight component; and the grasping member is assembled at one end of the lever while the weight component is assembled at the other end of the lever. According to the configuration described above, the grasping member can be moved with the inertia force in the direction for contacting the transfer object by a simple construction including the lever.

In at least an embodiment of the present invention, it is preferable that the grasping member is a rotatable roller. According to the configuration described above, even if the transfer object is dislocated on the robot hand at the time when the grasping member contacts the transfer object, the transfer object can be guided rightly to a prescribed position without causing any damage to the transfer object.

As described above, an industrial robot according to at least an embodiment of the present invention is able to reduce a physical impact to be made upon a transfer object when the transfer object is grasped by mechanical construction.

As described above, an industrial robot according to at least an embodiment of the present invention is able to grasp and release a transfer object by using simple construction.

BRIEF DESCRIPTION OF DRAWINGS

Embodiments will now be described, by way of example only, with reference to the accompanying drawings which are meant to be exemplary, not limiting, and wherein like elements are numbered alike in several Figures, in which:

FIG. 1 is a side view showing an industrial robot according to at least an embodiment of the present invention.

FIGS. 2A and 2B illustrate plan views of the industrial robot shown in FIG. 1, wherein FIG. 2A illustrates a posture in which a multi-joint arm section, according to a first embodiment, is expanded and FIG. 2B illustrates another posture in which the multi-joint arm section is folded.

FIG. 4 is a schematic sectional view for describing a power transmission mechanism inside the multi-joint arm section and a robot hand, both of which are shown in FIG. 1.

FIG. 7 is a sectional view describing a structure of a section 'F' shown in FIG. 2A in a view from a sectional direction.

FIG. 8 is a sectional view describing a structure of a section 'G' shown in FIG. 2A in a view from a sectional direction.

FIGS. 10A-10C illustrate an operation of a grasping part shown in FIG. 6.

FIG. 11 is a drawing that describes a relationship between a speed of a driving motor for a hollow turning shaft and a rotation angle of a first arm when the robot shown in FIG. 1 takes out and brings in a wafer.

FIG. 12 is a drawing that describes a relationship between a speed of the driving motor for the hollow turning shaft and a rotation angle of the first arm when the wafer is taken out and brought in, in accordance with another embodiment of the first embodiment relating to the present invention.

FIGS. 17A-17B are plan views of the industrial robot shown in FIG. 1, wherein FIG. 17A illustrates a posture in which a multi-joint arm section, according to a second embodiment, is expanded and FIG. 17B illustrates another posture in which the multi-joint arm section is folded.

FIGS. 19A and 19B are plan views showing a key section of the robot hand illustrated in FIG. 1; wherein FIG. 19A shows a condition where a grasping part is evacuated from the wafer and FIG. 19B shows another condition where the grasping part is grasping the wafer.

FIG. 20 is a side view of the key section of the robot hand illustrated in FIG. 19.

DETAILED DESCRIPTION OF PREFERRED EMBODIMENTS

Embodiments of the present invention are described below with reference to the accompanying drawings.

First Embodiment (Schematic View of Industrial Robot)

Figure 2A:
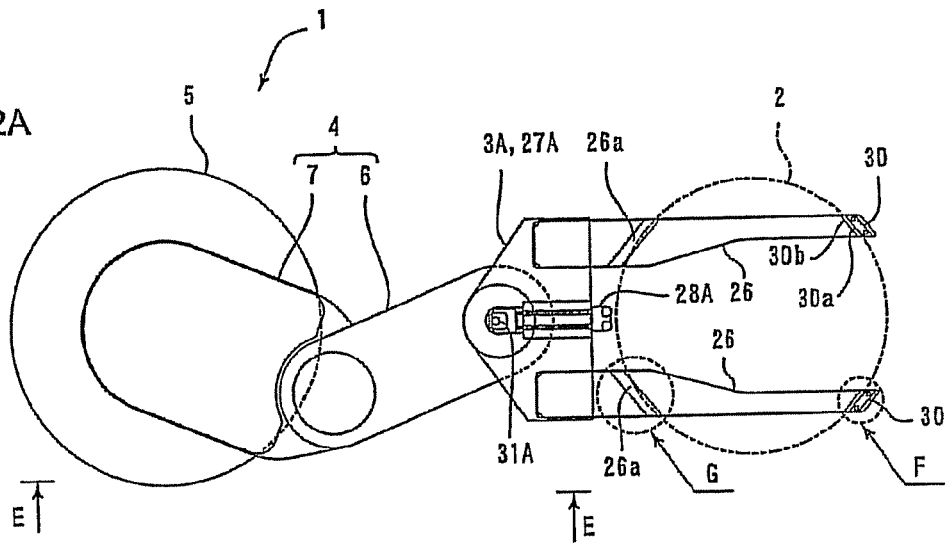
Figure 2B:
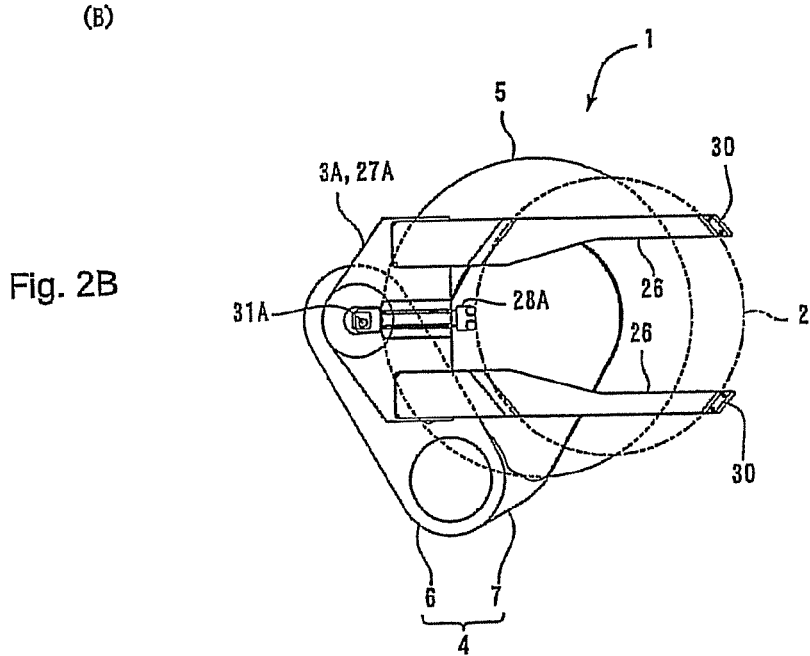
Figure 3:
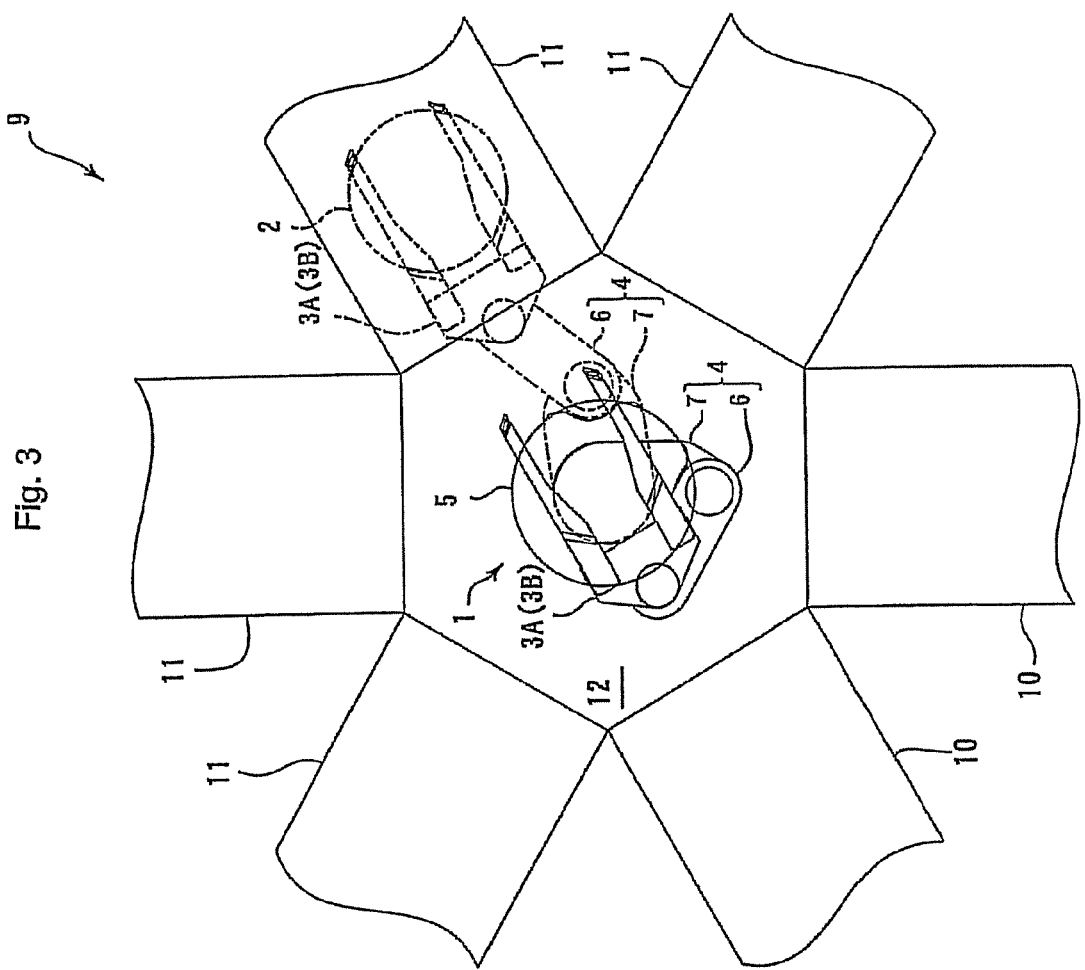
FIG. 3 is a plan view showing a schematic view of a semiconductor manufacturing system in which the industrial robot shown in FIG. 1 is used.

FIG. 1 is a side view showing an industrial robot 1 according to at least an embodiment of the present invention. FIG. 2 illustrates plan views of the industrial robot 1 shown in FIG. 1, wherein FIG. 2A illustrates a posture in which a multi-joint arm section 4 is expanded and FIG. 2B illustrates another posture in which the multi-joint arm section 4 is folded. FIG. 3 is a plan view showing a schematic view of a semiconductor manufacturing system 9 in which the industrial robot 1 shown in FIG. 1 is built. FIG. 4 is a schematic sectional view for describing a power transmission mechanism inside the multi-joint arm section 4 and a robot hand 3A, both of which are shown in FIG. 1. FIGS. 5A-5D a relationship between the expanding/folding condition of the multi-joint arm section 4, shown in FIG. 1, and the orientation of the robot hand 3A. Meanwhile, FIG. 4 is a schematic sectional view of the multi-joint arm section 4 and others when these parts are viewed in a direction of 'E-E' indicated in FIG. 2A.

The industrial robot 1 of the first embodiment (hereinafter, called as 'the robot 1') transfers a thin disc-shaped semiconductor wafer 2 (hereinafter, called as 'the wafer 2') as a transfer object. As shown in FIG. 1 and FIG. 2, the robot 1 includes: the robot hand 3A for loading the wafer 2 on it; the multi-joint arm section 4, which supports the robot hand 3A so as to keep it rotatable, and is expanded and folded when transferring the wafer 2; and a main section 5 that supports the multi-joint arm section 4 so as to keep it rotatable. The multi-joint arm section 4 of the first embodiment is composed of two robot arms; i.e., a second arm 6 and a first arm 7.

The robot 1 of the first embodiment is built in the semiconductor manufacturing system 9 for its use, as shown in FIG. 3 for example. Concretely to describe, the robot 1 is built in the semiconductor manufacturing system 9 including: delivery chambers 10 through which the wafer 2 is delivered and received between the semiconductor manufacturing system 9 and an external apparatus (not shown); processing chambers 11 in which prescribed processing is carried out for the wafer 2; and a transfer chamber 12 where the robot 1 is placed; and the robot 1 is used under the condition.

As shown in FIG. 3, a plurality of delivery chambers 10 (2 sets in the example of FIG. 3) and a plurality of processing chambers 11 (4 sets in the example of FIG. 3) are placed around the transfer chamber 12 in the semiconductor manufacturing system 9. Furthermore, a gate (not shown) is placed for delivering and receiving the wafer 2 between each of the delivery chambers 10 or processing chambers 11 and the transfer chamber 12.

The robot 1 placed in the transfer chamber 12 takes out the wafer 2 from one of the delivery chambers 10 or processing chambers 11 and then brings the wafer 2 into another of the delivery chambers 10 or processing chambers 11. In other words, the wafer 2 is delivered and received among the delivery chambers 10 and processing chambers 11 while the multi-joint arm section 4 being expanded and folded. Concretely to describe, to bring the wafer 2 into one of the delivery chambers 10 or processing chambers 11, the folded multi-joint arm section 4 gets expanded so that the robot hand 3A passes through the gate to enter an internal part of the chamber. Meanwhile, to take out the wafer 2, the multi-joint arm section 4 being expanded and placed in the delivery chamber 10 or processing chamber 11 now gets folded so that the robot hand 3A passes through the gate to return to an internal part of the transfer chamber 12.

When the wafer 2 is handled; the delivery chambers 10, the processing chambers 11, and the transfer chamber 12 are all under vacuum. Namely, the robot 1 according to the present embodiment is used under vacuum. Incidentally, in the case of the first embodiment, the delivery chambers 10 and the processing chambers 11 are storage sections where the wafer 2 as a transfer object is stored.

As FIGS. 1 and 2 show, a root end of the robot hand 3A is connected to a top end of the second arm 6 while being rotatable. A root end of the second arm 6 is connected to a top end of the first arm 7 while being rotatable. A root end of the first arm 7 is connected to the main section 5 while being rotatable. Furthermore, in the vertical direction; the robot hand 3A, the second arm 6, the first arm 7, and the main section 5 are positioned in this order from the top toward the bottom. In the present embodiment, the second arm 6 works as a hand supporting arm that supports the robot hand 3A at a top end of the arm so as to keep the robot hand 3A rotatable.

The main section 5 is formed so as to have a cylindrical contour in general at its outer shape. The main section 5 includes: a solid turning shaft 15 placed at a center in a radial direction; a hollow turning shaft 16 placed concentrically with the solid turning shaft 15 so as to cover an circumference surface of the solid turning shaft 15; a pulley 17 fixed to a top end of the solid turning shaft 15; a driving motor (not shown) for turning the solid turning shaft 15; and another driving motor (not shown) for turning the hollow turning shaft 16. Meanwhile, a top end of the hollow turning shaft 16 is fixed to a bottom surface of the first arm 7 at the root end of the first arm 7.

The hollow turning shaft 16 can rotate in a relative manner with the solid turning shaft 15. Furthermore, the main section 5 has a connecting mechanism (not shown) for connecting the solid turning shaft 15 and the hollow turning shaft 16 so that the solid turning shaft 15 and the hollow turning shaft 16 are also able to rotate together.

As shown in FIG. 4, having a hollow section, the first arm 7 is formed to be hollow in general. Inside an internal space at the root end of the first arm 7, the pulley 17 is placed. Meanwhile, inside an internal space at the top end of the first arm 7, a fixed shaft 18 is fixed.

As shown in FIG. 4, having a hollow section, the second arm 6 is also formed to be hollow in general, as the first arm 7 is. At a bottom side of the root end of the second arm 6, a pulley 19 is fixed. Furthermore, inside an internal space at the top end of the second arm 6, a fixed shaft 20 is fixed. The pulley 19 includes a first pulley section 19a placed inside the second arm 6 and a second pulley section 19b placed inside the internal space at the top end of the first arm 7. The fixed shaft 18 is inserted through the pulley 19, which is rotatable in relation to the fixed shaft 18. A belt 21 is placed between the pulley 17 and the second pulley section 19b to connect the two pulleys.

At a bottom surface of the root side of the robot hand 3A, a pulley 22 is fixed. Then, the pulley 22 is positioned inside the internal space at the top end of the second arm 6. The fixed shaft 20 is inserted through the pulley 22, which is rotatable in relation to the fixed shaft 20. A belt 23 is placed between the pulley 22 and the first pulley section 19a to connect the two pulleys.

A detailed structure of the robot hand 3A as well as a detailed structure of a connection part that connects the second arm 6 and the robot hand 3A are described later.

In the first embodiment; if the hollow turning shaft 16 rotates while the solid turning shaft 15 being fixed, the multi-joint arm section 4 is expanded and folded. In other words, when the driving motor for the hollow turning shaft 16 drives under a prescribed condition, the multi-joint arm section 4 takes actions of expanding and folding. Meanwhile, if both the solid turning shaft 15 and the hollow turning shaft 16 rotate together as a whole, the multi-joint arm section 4 takes no action of expanding and folding but the multi-joint arm section 4 rotates in relation to the main section 5. In other words, when the driving motor for the solid turning shaft 15 drives under a prescribed condition, the multi-joint arm section 4 takes actions of rotating.

In the first embodiment; a distance between the pulley 17 and the pulley 19 is equal to a distance between the pulley 19 and the pulley 22. Meanwhile, a ratio of diameters of the pulley 17 and the second pulley section 19b is 2:1, and a ratio of diameters of the first pulley section 19a and the pulley 22 is 1:2. As a result, in the present embodiment; if the hollow turning shaft 16 rotates while the solid turning shaft 15 being fixed as shown in FIGS. 5A-5D, an angle formed by the robot hand 3A and the second arm 6 as well as another angle formed by the second arm 6 and the first arm 7 both change. However, under the condition, the robot hand 3A moves along a virtual line 'X' stretched from the center of the pulley 17 (i.e., the center of the main section 5) and the center of the pulley 22 (i.e., the turning center of the robot hand 3A) while keeps the orientation of the robot hand 3A unchanged. The robot 1 according to at least an embodiment of the present invention is a so-called cylindrical robot that moves in a radial direction while keeping the orientation of the robot hand 3A unchanged when the multi-joint arm section 4 is expanded and folded.

Figure 5A:
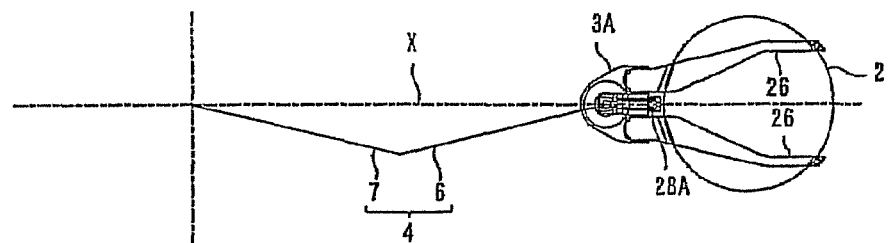
FIGS. 5A-5D illustrate a relationship between the expanding/folding condition of the multi-joint arm section, shown in FIG. 1, and the orientation of the robot hand.
Figure 5B:
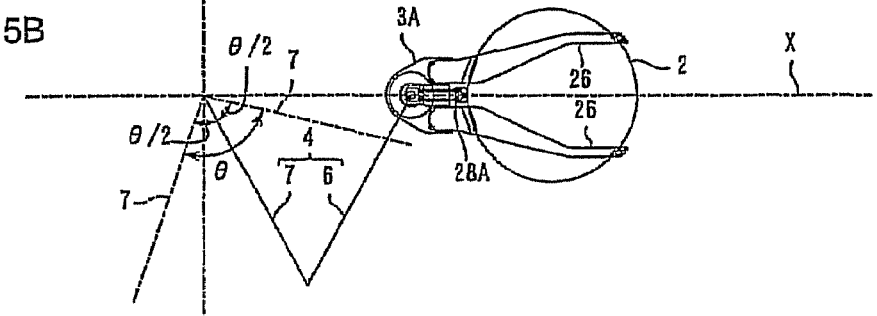
Figure 5C:
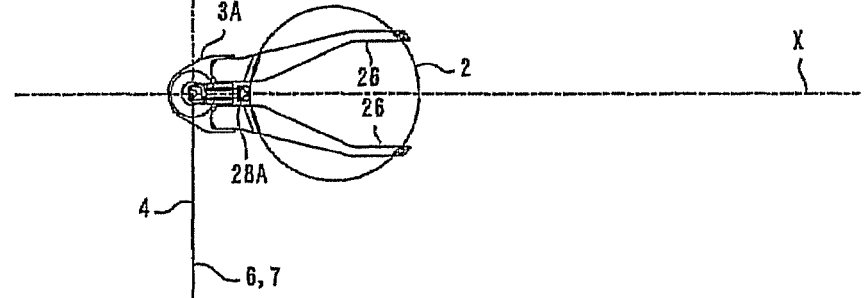
Figure 5D:
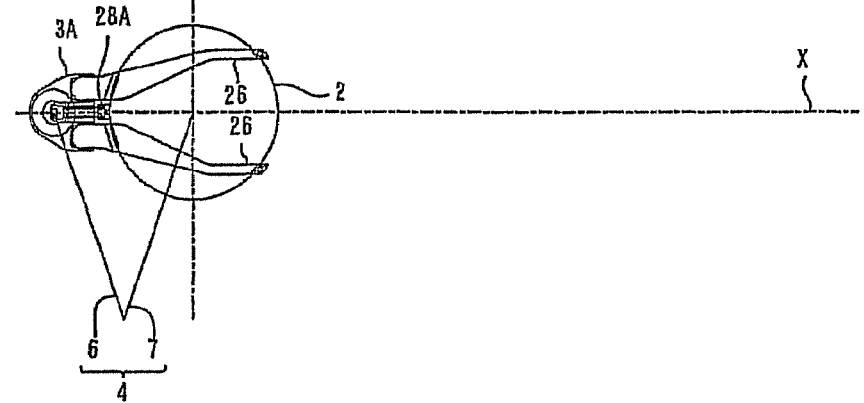

FIG. 5A shows a condition in which the multi-joint arm section 4 is fully expanded, and an operation of taking out the wafer 2 from one of the delivery chambers 10 or processing chambers 11 starts under the condition. Meanwhile, FIG. 5D shows another condition in which the multi-joint arm section 4 is fully folded, and an operation of bringing the wafer 2 into one of the delivery chambers 10 or processing chambers 11 starts under the condition. Furthermore, FIG. 5B shows still another condition in which the multi-joint arm section 4 is just halfway in the expanding/folding motion. In other words; where the angle formed by turning motion of the first arm 7, while the multi-joint arm section 4 executes the folding motion from the condition shown in FIG. 5A to the condition shown in FIG. 5D, is represented as a rotation angle 'θ'; FIG. 5B shows the condition in which an angle formed by the first arm 7 of FIG. 5A and that of FIG. 5B (or an angle formed by the first arm 7 of FIG. 5D and that of FIG. 5B) is 'θ/2'. Moreover, FIG. 5C shows a condition in which the turning center of the robot hand 3A coincides with the center of the main section 5.

(Structures of the Robot Hand and the Connection Part Connecting the Robot Hand and the Second Arm)

Figure 6:
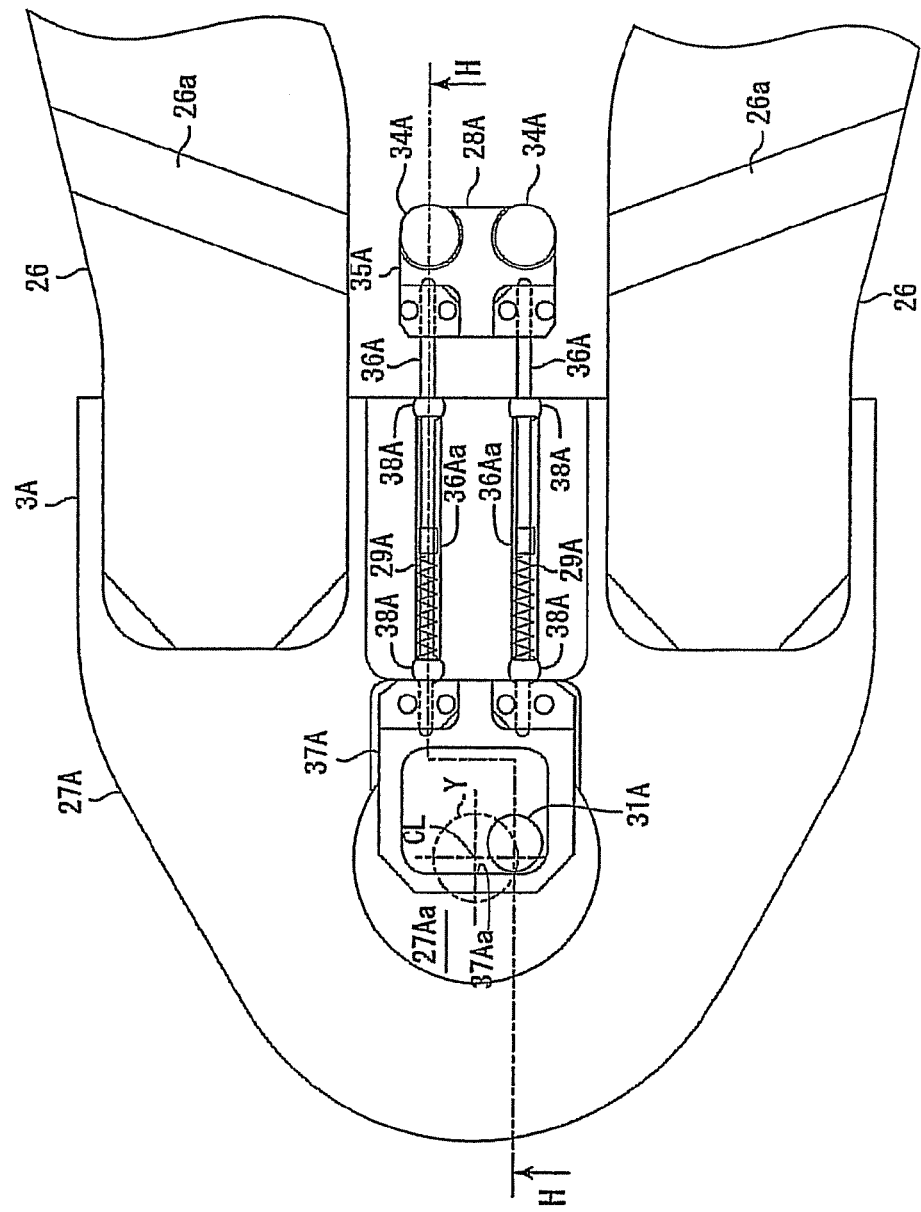
FIG. 6 is a plan view showing a key section of the robot hand illustrated in FIG. 1 and an eccentric member.

FIG. 6 is a plan view showing a key section of the robot hand 3A illustrated in FIG. 1 and an eccentric member 31A.

FIG. 7 is a sectional view describing a structure of a section 'F' shown in FIG. 2A in a view from a sectional direction.

FIG. 8 is a sectional view describing a structure of a section

Figure 9:
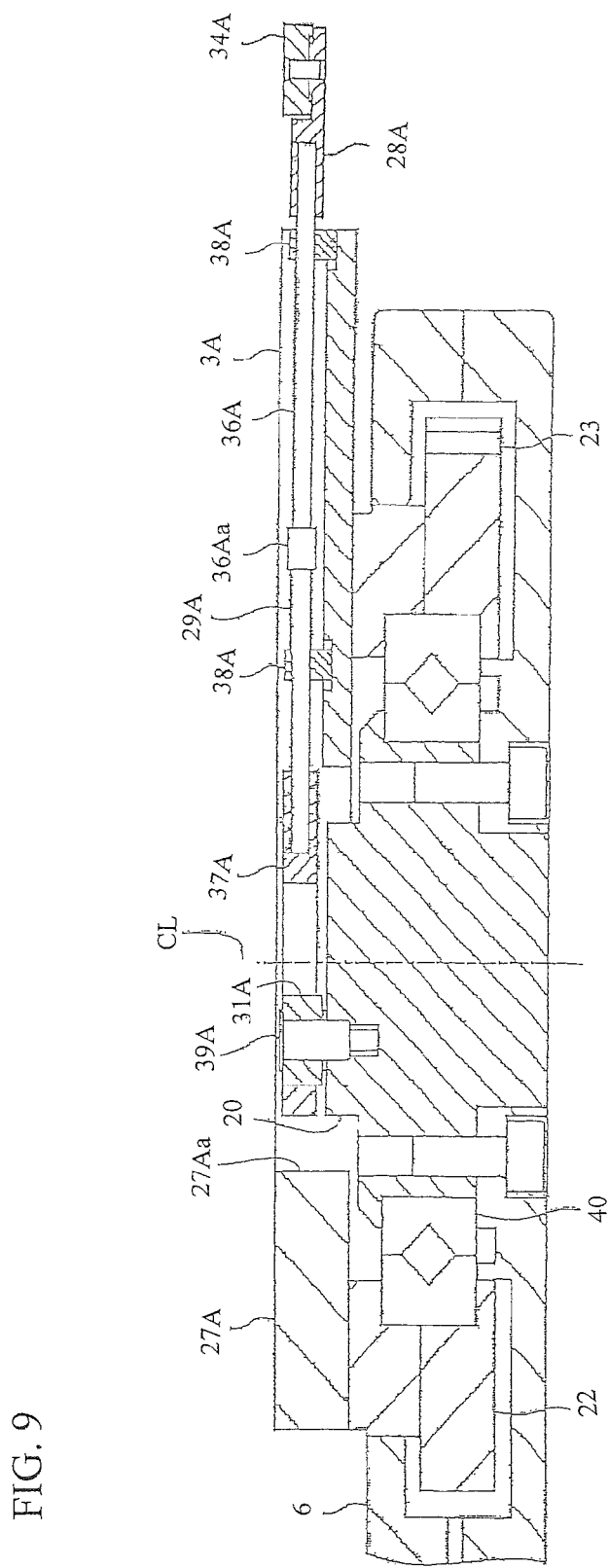
FIG. 9 is a sectional view illustrating a section 'H-H' shown in FIG. 6.

'G' shown in FIG. 2A in a view from a sectional direction. FIG. 9 is a sectional view illustrating a section 'H-H' shown in FIG. 6. FIGS. 10A-10C illustrate an operation of a grasping part 28A shown in FIG. 6. FIG. 11 is a drawing that describes a relationship between a speed of the driving motor for the hollow turning shaft 16 and a rotation angle of the first arm 7 when the robot 1 shown in FIG. 1 takes out and brings in the wafer 2.

FIG. 10A illustrates a condition of the grasping part 28A and the eccentric member 31A corresponding to the condition of FIG. 5A (i.e., the condition where the multi-joint arm section 4 is fully expanded). Meanwhile, FIG. 10B illustrates another condition of the grasping part 28A and the eccentric member 31A corresponding to the condition of FIG. 5B (i.e., the condition where the multi-joint arm section 4 is just half-way in the expanding/folding motion). Furthermore, FIG. 10C illustrates still another condition of the grasping part 28A and the eccentric member 31A corresponding to the condition of FIG. 5D (i.e., the condition where the multi-joint arm section 4 is fully folded). In the following descriptions, the vertical direction and the horizontal direction in FIG. 6 are dealt with as a longitudinal direction and a cross direction, respectively, as a matter of convenience.

As shown in FIG. 6 and other drawings, the robot hand 3A includes: two mounting members 26 for mounting the wafer 2; a base 27A to which root sides of the two mounting members 26 are fixed; the grasping part 28A for grasping the wafer 2 by contacting an edge of the wafer 2; compression coil springs 29A as biasing members that bias the grasping part 28A in a direction for grasping the wafer 2; and contacting members 30 as contacting sections that edges of the wafer 2 contact. Furthermore, as FIG. 9 shows, the second arm 6 includes the eccentric member 31A that is fixed to the second arm 6 at an eccentric position away from a turning center of 'CL' of the robot hand 3A in relation to the second arm 6.

The mounting members 26 are thin plate members, for example, formed with ceramic. As described above, the root sides of the two mounting members 26 are fixed to the base 27A. Specifically, as shown in FIG. 2 and other drawings, the root sides of the two mounting members 26 are fixed to the base 27A while the two members having a prescribed space between them in a cross direction and being almost parallel to each other. Formed at a root end of each of the mounting members 26 is a slope 26a, which a bottom corner of an edge of the wafer 2 contacts. Concretely to describe; as shown in FIG. 8, the slope 26a is so formed as to gently descend in a direction toward the top end of each mounting member 26. Furthermore, as shown in FIG. 2A; when being seen in the plan view of the drawing, the slope 26a is so formed as to become almost parallel to a tangential line at a contact point of the wafer 2 contacting the slope 26a.

Each of the contacting members 30 is fixed at a top position of each of the two mounting members 26. Formed at each contacting member 30 are a vertical surface 30a which an edge of the wafer 2 contacts, and a slope 30b which a bottom corner of the edge of the wafer 2 contacts, as shown in FIG. 7. The slope 30b is so formed from a lower end of the vertical surface 30a toward the root end of the robot hand 3A as to gently descend in a direction toward the root end of the robot hand 3A. Furthermore, as shown in FIG. 2A; when being seen in the plan view of the drawing, the vertical surface 30a and the slope 30b are so formed as to become almost parallel to a tangential line at a contact point of the wafer 2 contacting the slope 30b.

As described later, the vertical surface 30a works together with the grasping part 28A for grasping the wafer 2. Furthermore, as described later, the vertical surface 30a works for preventing the wafer 2 from getting dislocated when the wafer 2 is taken out and brought in.

The base 27A is included in the root side part of the robot hand 3A. As shown in FIG. 9, the pulley 22 is fixed to a bottom surface of the base 27A. Furthermore, formed in the base 27A is a circular through hole 27Aa in which the eccentric member 31A and others are placed.

The grasping part 28A is positioned at the root end of the robot hand 3A. Specifically, the grasping part 28A is assembled onto a top surface of the base 27A. Furthermore, the grasping part 28A is positioned between the two mounting members 26. As shown in FIG. 6 and others, the grasping part 28A includes: two rollers 34A that contact the wafer 2 and are rotatable; an almost block-shaped supporting member 35A that supports the two rollers 34A so as to keep the rollers rotatable; two shafts 36A for guiding the rollers 34A and the supporting member 35A in a longitudinal direction of FIG. 6; and a cylindrical cam part 37A, in which formed on an internal surface is a cam surface 37Aa that the eccentric member 31A contacts.

The two rollers 34A are so assembled as to have a prescribed space between them in a cross direction and to be rotatable at a forefront of the supporting member 35A. Furthermore, the rollers 34A are assembled into the supporting member 35A to protrude somewhat frontward from the forefront of the supporting member 35A so that the rollers can contact the wafer 2.

The shafts 36A are formed to be a slender cylindrical column. Each shaft 36A includes a spring contact part 36Aa which an end of each of the compression coil springs 29A contacts. Concretely to describe, the spring contact part 36Aa having a larger diameter is formed at a middle position in a longitudinal direction of the shaft 36A. Meanwhile, a tip of the shaft 36A is fixed to a root side of the supporting member 35A, and a tail of the shaft 36A is fixed to a forefront of the cam part 37A.

The two shafts 36A are so supported by slide bearings 38A, which are fixed onto the top surface of the base 27A, as to have a prescribed space between the two shafts 36A in a cross direction. Concretely to describe, each of the two shafts 36A is supported by the two slide bearings 38A that are so placed as to have a prescribed space between the two slide bearings 38A in a longitudinal direction. In the present embodiment, the two shafts 36A are guided by the slide bearings 38A to move linearly in the longitudinal direction. Namely, the two shafts 36A are guided by the slide bearings 38A to move linearly in one direction for grasping the wafer 2 (to the right in FIG. 6) and the other direction for evacuating from the wafer 2 (to the left in FIG. 6). As a result, the grasping part 28A moves linearly in the directions for grasping the wafer 2 and evacuating from the same.

Each of the two shafts 36A is inserted into an internal side of each of the compression coil springs 29A. Furthermore, the spring contact part 36Aa is located between the two slide bearings 38A that are so placed as to have the prescribed space between the two bearings in the longitudinal direction. Then the compression coil spring 29A is located between one of the slide bearings 38A, placed at a root side, and the spring contact part 36Aa. As a result, the shaft 36A is biased by the compression coil spring 29A in the direction for grasping the wafer 2. In other words, the grasping part 28A is biased by the compression coil spring 29A in the direction for grasping the wafer 2.

As described above, the cam part 37A is so formed as to be cylindrical. Specifically, a bore having an almost rectangular section is so formed in a vertical direction as to be an almost rectangular cylindrical through bore. Four internal surfaces of the bore are laid out, each couple of the two internal surfaces being parallel in the longitudinal direction or cross direction. In the present embodiment, the eccentric member 31A contacts the left internal surface of the cam part 37A in FIG. 6. Namely, the left internal surface of the cam part 37A in FIG. 6 is the cam surface 37Aa.

As shown in FIG. 9 and others, the eccentric member 31 is formed to have a thick cylindrical part, and it is assembled by a fixing bolt 39A onto a top end of the fixed shaft 20 fixed at the top end of the second arm 6. As described above, the eccentric member 31A is positioned eccentrically away from the turning center of 'CL' of the robot hand 3A. Therefore, according to the expanding/folding motion of the multi-joint arm section 4, the eccentric member 31A moves along a virtual circle 'Y' in comparison with the robot hand 3A.

The eccentric member 31A is located at the internal surface side of the cam part 37A, being enabled to contact the cam surface 37Aa. The eccentric member 31A in the present embodiment is installed at a position that is relatively closed to the turning center of 'CL' of the robot hand 3A. Concretely to describe, when being seen in the plan view of FIG. 6 for example, the turning center of 'CL' of the robot hand 3A is also located at the internal surface side of the cam part 37A.

The eccentric member 31A may be fixed to the top end of the fixed shaft 20 or assembled onto the same so as to be rotatable. Furthermore, the eccentric member 31A may be formed together with the fixed shaft 20 as one component. Moreover, as shown in FIG. 9, a bearing 40 is placed between the fixed shaft 20 and the pulley 22, and therefore the pulley 22 is rotatable in relation to the fixed shaft 20, as described above.

In the first embodiment, as shown in FIG. 2A; when the multi-joint arm section 4 is expanded (i.e., before starting operation of taking out the wafer 2 from one of the delivery chambers 10 or processing chambers 11), the grasping part 28A is under a condition of evacuating from the wafer 2. Namely, under the condition; the rollers 34A are away from the wafer 2, as shown in FIG. 10A. Concretely to describe, under the condition; the eccentric member 31A contacts the cam surface 37Aa so that the grasping part 28A is moved away by the eccentric member 31A in the evacuating direction, opposing against the biasing force by the compression coil springs 29A. Under the condition; as shown in FIG. 10A, the eccentric member 31A is located at a position close to a root side intersection of the virtual circle 'Y' and a virtual centerline that stretches in the longitudinal direction through the turning center of 'CL' of the robot hand 3A. Incidentally, the eccentric member 31A may be located at the root side intersection of the virtual circle 'Y' and the virtual centerline that stretches in the longitudinal direction through the turning center of 'CL', under the condition in which the multi-joint arm section 4 is expanded.

On the other hand, as shown in FIG. 2B; when the multi-joint arm section 4 is folded (i.e., before starting operation of bringing the wafer 2 into one of the delivery chambers 10 or processing chambers 11), the grasping part 28A is contacting and grasping the wafer 2. Namely, under the condition; the rollers 34A are contacting and grasping the wafer 2, as shown in FIG. 10C. Concretely to describe, under the condition; the eccentric member 31A is away from the cam surface 37Aa so that the grasping part 28A is moved in the grasping direction with the biasing force of the compression coil springs 29A. Under the condition; as shown in FIG. 10C, the eccentric member 31A is located at a position close to a lower intersection of the virtual circle 'Y' and a virtual centerline that stretches in the cross direction through the turning center of 'CL' of the robot hand 3A.

When the grasping part 28A grasps the wafer 2, vertical surfaces 30a of the contacting members 30 also contact the wafer 2. In other words, the wafer 2 is grasped by the grasping part 28A and the vertical surfaces 30a. In the present embodiment; being laid out at almost 120-degree pitch intervals as shown in FIG. 2, the grasping part 28A and the vertical surfaces 30a contact and grasp the wafer 2.

According as the multi-joint arm section 4 gets folded from an expanded condition to take out the wafer 2 from one of the delivery chambers 10 or processing chambers 11, the eccentric member 31A moves in comparison with the grasping part 28A so as to have the grasping part 28A move in the grasping direction in accordance with the motion of the multi-joint arm section 4. Concretely to describe, the eccentric member 31A moves in comparison with the grasping part 28A to revolve counterclockwise along the virtual circle 'Y' in FIGS. 10A-10C.

As described above; under the condition where the multi-joint arm section 4 is expanded, the eccentric member 31A is located at the position close to the root side intersection of the virtual circle 'Y' and the virtual centerline that stretches in the longitudinal direction through the turning center of 'CL' of the robot hand 3A. Therefore, according to the present embodiment; when the multi-joint arm section 4 starts getting folded out of the condition shown in FIG. 5A, a motion stroke of the eccentric member 31A in the longitudinal direction is just short at first in relation to the revolution angle of the eccentric member 31A. Then, the motion stroke of the eccentric member 31A in the longitudinal direction gradually increases in relation to the revolution angle of the eccentric member 31A. In other words; when the multi-joint arm section 4 starts getting folded, the grasping part 28A gently starts moving in the grasping direction.

According to the first embodiment, the eccentric member 31A is installed at the position that is relatively closed to the turning center of 'CL' of the robot hand 3A, as described above. Therefore, from a condition where the multi-joint arm section 4 is expanded until another condition where the multi-joint arm section 4 is considerably folded, the eccentric member 31A keeps contacting the cam surface 37Aa. As a result, the eccentric member 31A enables the grasping part 28A (specifically, the cam part 37A) to move smoothly along a sine curve.

Furthermore, the eccentric member 31A keeps contacting the cam surface 37Aa from a condition where the multi-joint arm section 4 is expanded until another condition where the multi-joint arm section 4 is considerably folded. Therefore, when the eccentric member 31A gets detached from the cam surface 37Aa, the grasping part 28A is located at a position close to the wafer 2. Incidentally, in the present embodiment, a restoring force of the compression coil springs 29A is comparatively light. Accordingly, even when the eccentric member 31A is detached from the cam surface 37Aa, the grasping part 28A does not contact the wafer 2 in such a way as to make a physical impact on the wafer 2.

Contrarily, according as the multi-joint arm section 4 gets expanded from an folded condition to bring the wafer 2 into one of the delivery chambers 10 or processing chambers 11, the eccentric member 31A moves in comparison with the grasping part 28A so as to have the grasping part 28A move in the evacuating direction in accordance with the motion of the multi-joint arm section 4. Concretely to describe, the eccentric member 31A moves in comparison with the grasping part 28A to revolve clockwise along the virtual circle 'Y' in FIGS. 10A-10C.

According to the first embodiment; when the multi-joint arm section 4 is just halfway in the expanding/folding motion as shown in FIG. 5B, the eccentric member 31A contacts the cam surface 37Aa but the grasping part 28A does not contact the wafer 2, as shown in FIG. 10B. In other words, the grasping part 28A does not contact the wafer 2 unless the multi-joint arm section 4 gets further folded from the halfway condition shown in FIG. 5B.

According to the present embodiment; in the case of taking out or bringing in the wafer 2, the turning speed (RPM) of the driving motor for the hollow turning shaft 16 changes as FIG. 11 shows. Namely, after having accelerated, the driving motor for the hollow turning shaft 16 decelerates without any constant-speed operation. In other words, the expanding/folding motion of the multi-joint arm section 4 according to the turning operation of the hollow turning shaft 16 includes only accelerating and decelerating motion without any constant-speed operation.

Furthermore, in the present embodiment; an accelerating rate and a decelerating rate of the driving motor for the hollow turning shaft 16 are the same each other. Then, the accelerating and decelerating motion of the driving motor for the hollow turning shaft 16 is switched at the timing of the condition shown in FIG. 5B. In other words, the acceleration and deceleration of the expanding/folding motion of the multi-joint arm section 4 is switched when the first arm 7 has turned for 'θ/2' after a start of taking out or bringing in the wafer 2.

As described above, in the condition shown in FIG. 5B according to the present embodiment, the grasping part 28A does not contact nor grasp the wafer 2. Accordingly in the present embodiment, at the time of decelerating motion of the multi-joint arm section 4 when the multi-joint arm section 4 is folded (namely, at the time of taking out the wafer 2), the grasping part 28A contacts the wafer 2 with the biasing force of the compression coil springs 29A so as to start grasping the wafer 2. Namely, at the time of accelerating motion, at least, of the multi-joint arm section 4 when the multi-joint arm section 4 is folded, the grasping part 28A does not grasp the wafer 2.

Furthermore, in the present embodiment; at the time of accelerating motion of the multi-joint arm section 4 when the multi-joint arm section 4 is expanded (namely, at the time of bringing in the wafer 2), the grasping part 28A starts departing from the wafer 2 due to the motion of the eccentric member 31A (namely, to start evacuation from the wafer 2) so as to release the wafer 2. Namely, at the time of decelerating motion, at least, of the multi-joint arm section 4 when the multi-joint arm section 4 is expanded, the grasping part 28A does not grasp the wafer 2.

Incidentally, at the time of accelerating motion of the multi-joint arm section 4 for taking out the wafer 2, an inertia force acts on the wafer 2 relatively in the direction toward the top end of the robot hand 3A. Furthermore, also at the time of decelerating motion of the multi-joint arm section 4 for bringing in the wafer 2, an inertia force acts on the wafer 2 relatively in the direction toward the top end of the robot hand 3A. Therefore, at the time of such accelerating or decelerating motion, the wafer 2 contacts the vertical surfaces 30a of the contacting members 30 so as to prevent the wafer 2 itself from dislocation.

Advantageous Effect of the First Embodiment

According to the present embodiment as described above; before starting the operation of taking out the wafer 2, the eccentric member 31A contacts the cam surface 37Aa so as to evacuate the grasping part 28A from the wafer 2. Furthermore, when the multi-joint arm section 4 is folded for taking out the wafer 2, the eccentric member 31A moves in comparison with the grasping part 28A so as to have the grasping part 28A move in the grasping direction. Then, at the time of deceleration in the expanding/folding motion of the multi-joint arm section 4 for taking out the wafer 2, the grasping part 28A starts grasping the wafer 2 with the biasing force of the compression coil springs 29A.

Therefore, at the time of taking out the wafer 2, the eccentric member 31A can contact the cam surface 37Aa for a comparatively long time from starting the expanding/folding motion of the multi-joint arm section 4 until the time of deceleration in the expanding/folding motion of the multi-joint arm section 4. Accordingly, motion speed of the grasping part 28A can be controlled by the eccentric member 31A, and therefore the wafer 2 can be grasped by having the grasping part 28A contact the wafer 2 relatively slowly. As a result, according to the present embodiment; when the wafer 2 is grasped even with the mechanical construction by using the grasping part 28A, the compression coil springs 29A, and the eccentric member 31A, the physical impact given onto the wafer 2 can be reduced.

In the present embodiment; the wafer 2 is grasped with the biasing force of the compression coil springs 29A, before starting the operation of bringing in the wafer 2. Furthermore, when the multi-joint arm section 4 is expanded for bringing in the wafer 2, the eccentric member 31A moves in comparison with the grasping part 28A so as to have the grasping part 28A move in the evacuating direction. Also, at the time of acceleration in the expanding/folding motion of the multi-joint arm section 4 for bringing in the wafer 2, the grasping part 28A starts evacuating from the wafer 2. Therefore, the grasping part 28A can be evacuated from the wafer 2 for a comparatively long time from the time of acceleration in the expanding/folding motion of the multi-joint arm section 4 for bringing in the wafer 2 until the middle of the expanding/folding motion of the multi-joint arm section 4. As a result, according to the present embodiment; damage caused onto various parts included in the grasping part 28A can be reduced.

In the present embodiment, the grasping part 28A is placed at the root side of the robot hand 3A while the contacting members 30 are fixed at the top end of the mounting members 26 placed at the top end of the robot hand 3A. Therefore, even when grasping the wafer 2 starts at the time of deceleration in the expanding/folding motion of the multi-joint arm section 4 for taking out the wafer 2, the contacting members 30 (specifically, the vertical surfaces 30a) can prevent the wafer 2 from dislocation at the time of acceleration in the expanding/folding motion of the multi-joint arm section 4 for taking out the wafer 2. Furthermore, even when evacuating the grasping part 28A from the wafer 2 starts at the time of acceleration in the expanding/folding motion of the multi-joint arm section 4 for bringing in the wafer 2, the contacting members 30 can prevent the wafer 2 from dislocation at the time of deceleration in the expanding/folding motion of the multi-joint arm section 4 for bringing in the wafer 2.

In the present embodiment, the grasping part 28A includes the rollers 34A that are rotatable and contact the wafer 2. Therefore, even if the wafer 2 is dislocated on the robot hand 3A when the grasping part 28A contacts the wafer 2, the wafer 2 can be set rightly at a prescribed position with behavior of the rollers 34A without causing any damage onto the wafer 2.

In the present embodiment, the grasping part 28A moves linearly in the grasping direction to the wafer 2 as well as the evacuating direction from the wafer 2. Therefore, being compared with a case of Patent Document 1 described above using a lever mechanism, the present embodiment makes the installation space for the grasping part 28A narrower and ensures downsizing and thin-profiling design of the robot hand 3A. Furthermore, in the present embodiment, the grasping part 28A includes the two shafts 36A that are guided linearly by the slide bearings 38A. Therefore, the two shafts 36A prevent the grasping part 28A from rotation with the moving direction of the grasping part 28A as a rotation center.

In the present embodiment, the grasping part 28A includes the cam part 37A, in which formed on the internal surface is the cam surface 37Aa that the eccentric member 31A contacts. Therefore, equipped with the eccentric member 31A and the cam part 37A, the grasping part 28A is constructed with a simple structure, and the grasping part 28A can move linearly in the grasping direction to the wafer 2 as well as the evacuating direction from the wafer 2.

Other Embodiments of the First Embodiment

The embodiment described above is an example of a preferred embodiment in accordance with at least an embodiment of the present invention, but at least an embodiment of the present invention is not limited to the above embodiment and various variations may be made without changing the concept of the present invention.

According to the first embodiment described above, grasping the wafer 2 starts while the grasping part 28A contacts the wafer 2 at the time of deceleration in the motion of the multi-joint arm section 4 when the multi-joint arm section 4 is folded. In any other possible case for example, as shown in FIG. 12; if the driving motor for turning the hollow turning shaft 16 accelerates, turns at a constant speed, and then decelerates for taking out and bringing in the wafer 2; grasping the wafer 2 may start while the grasping part 28A contacts the wafer 2 at the time of constant-speed turning of the multi-joint arm section 4 when the multi-joint arm section 4 is folded.

Even in this case, therefore the wafer 2 can be grasped by having the grasping part 28A contact the wafer 2 relatively slowly and the physical impact given onto the wafer 2 can be reduced. Incidentally, even in a case where the driving motor for turning the hollow turning shaft 16 turns at a constant speed, grasping the wafer 2 may start while the grasping part 28A contacts the wafer 2 at the time of deceleration in the motion of the multi-joint arm section 4 when the multi-joint arm section 4 is folded.

According to the embodiment described above, the grasping part 28A starts evacuating from the wafer 2 at the time of acceleration in the motion of the multi-joint arm section 4 when the multi-joint arm section 4 is expanded. In any other possible case for example; if the driving motor for turning the hollow turning shaft 16 accelerates, turns at a constant speed, and then decelerates for taking out and bringing in the wafer 2; the grasping part 28A may start evacuating from the wafer 2 at the time of constant-speed turning of the multi-joint arm section 4 when the multi-joint arm section 4 is expanded. Even in this case, therefore the grasping part 28A can be evacuated from the wafer 2 relatively slowly and the damage caused onto the various parts included in the grasping part 28A can be reduced. Incidentally, even in a case where the driving motor for turning the hollow turning shaft 16 turns at a constant speed, the grasping part 28A may start evacuating from the wafer 2 at the time of acceleration in the motion of the multi-joint arm section 4 when the multi-joint arm section 4 is expanded.

Furthermore, though the accelerating rate and decelerating rate of the driving motor for the hollow turning shaft 16 are the same each other in the embodiment described above, the accelerating rate and decelerating rate of the driving motor for the hollow turning shaft 16 may be different each other.

Figure 13A:
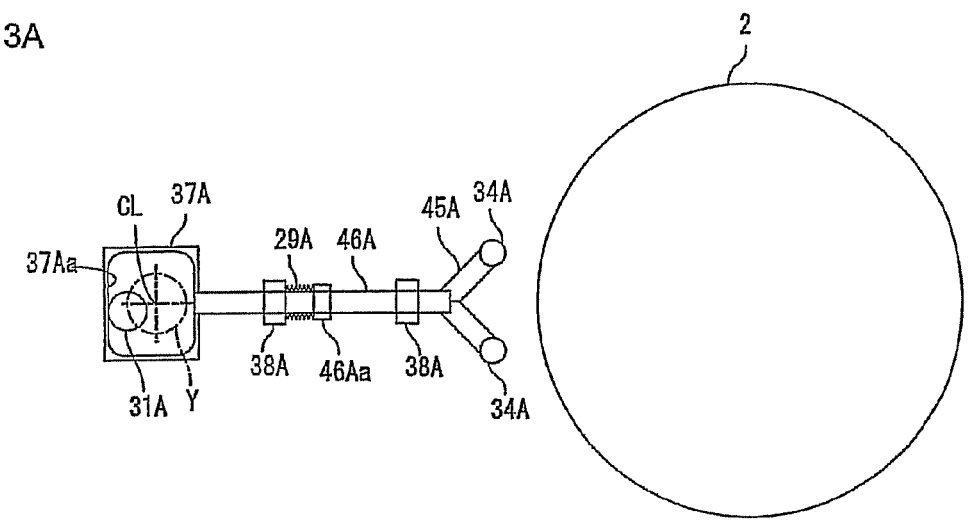
FIGS. 13A-13B illustrate a grasping part in accordance with at least another embodiment of present invention.
Figure 13B:
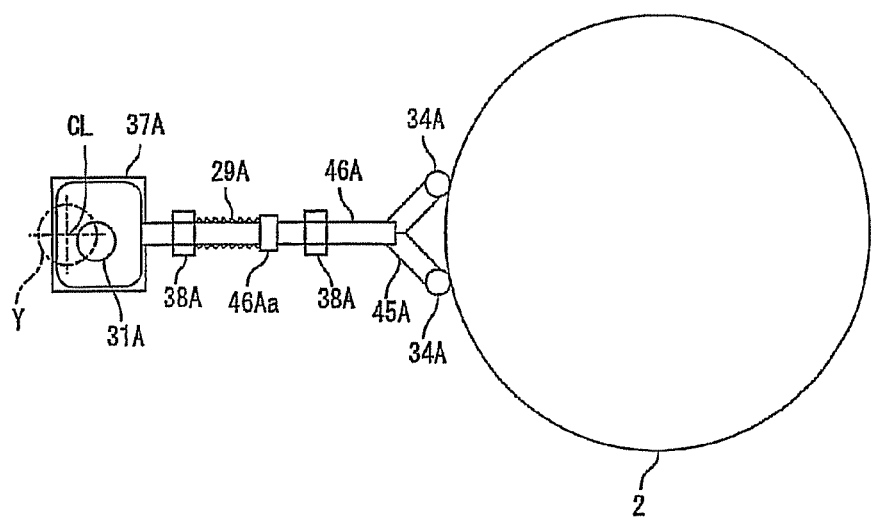

In the embodiment described above, the grasping part 28A includes the two shafts 36A. As another possibility for example, the grasping part 28A may include three shafts 36A or more. Furthermore, the grasping part 28A may include only one shaft 46A, as shown in FIGS. 13A-13B. Formed in the shaft 46A is a spring contact part 46Aa that corresponds to the spring contact part 36Aa. In this case, a supporting member 45A formed in a V-shape should be fixed instead of the supporting member 35A at a top end of the shaft 46A. Incidentally, when only one shaft 46A is used, the shaft 46A should preferably be formed to be a polygonal rod, not a circular rod, for the purpose of preventing the shaft 46A from turning. In FIGS. 13A-13B, the same symbols as those of the embodiment described before are used for functions corresponding to the like functions of this embodiment.

Figure 14A:
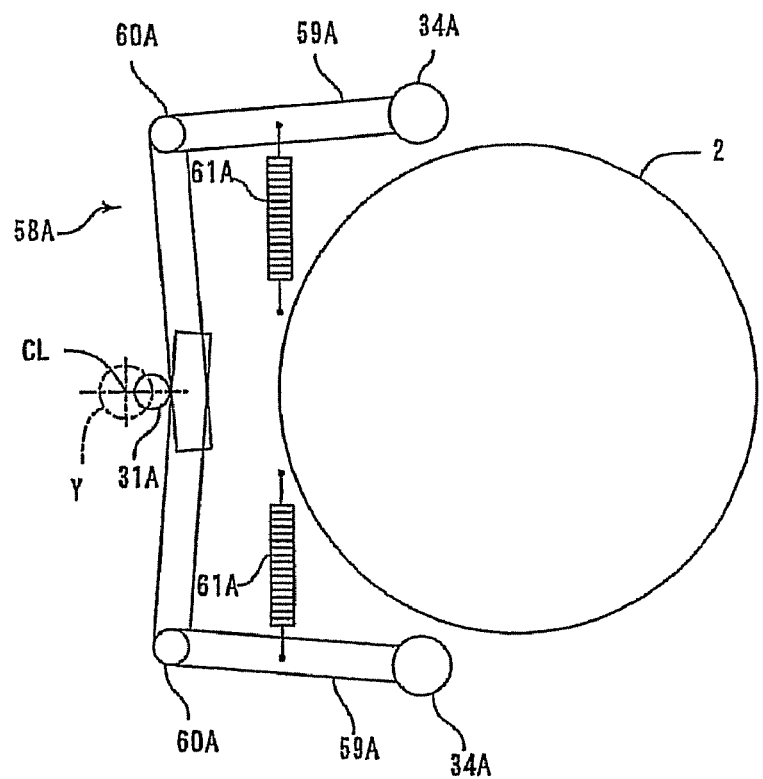
FIGS. 14A-14B illustrate a grasping part in accordance with at least another embodiment of the present invention.
Figure 14B:
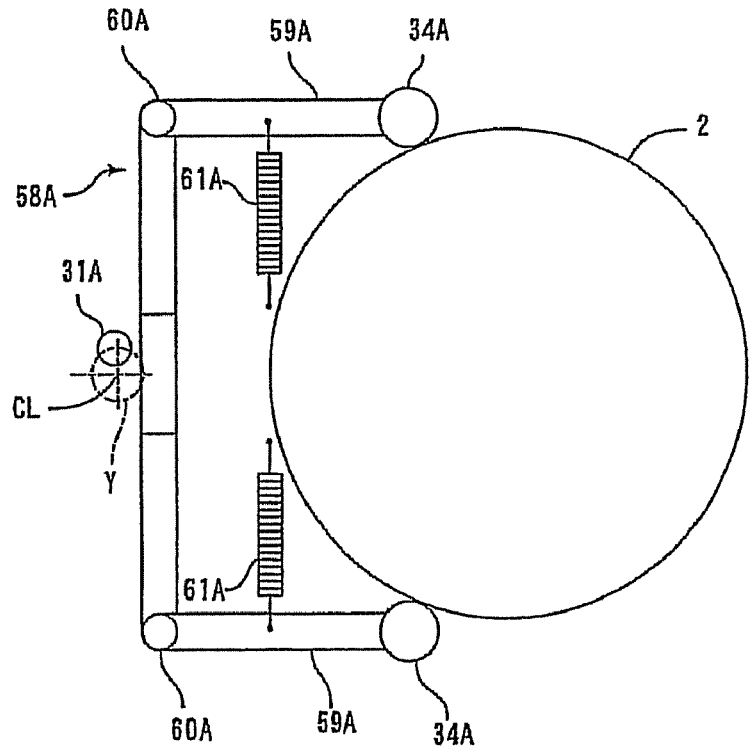

In the embodiment described above, the robot hand 3A includes the two shafts 36A and the grasping part 28A that moves linearly in the grasping direction and evacuating direction. As another possibility for example, the robot hand 3A may include a grasping part 58A instead of the grasping part 28A, as shown in FIGS. 14A-14B; the grasping part including a couple of levers 59A having the rollers 34A, and each of the levers 59A turning in relation to a specific axis 60A so as to grasp the wafer 2.

In the grasping part 58A, the lever 59A is formed to be L-shaped and biased in a direction for grasping the wafer 2 by each of tension coil springs 61A. Furthermore, each of the rollers 34A is placed so as to be rotatable at one end of the lever 59A. Moreover, at the other end of the lever 59A, the eccentric member 31A is able to contact the lever 59A. Therefore, with the eccentric member 31A assembled at a specific position of the top end of the fixed shaft 20; when the multi-joint arm section 4 is expanded, the eccentric member 31A contacts the lever 59A so that the lever 59A turns opposing against the biasing force by the tension coil springs 61A to evacuate the roller 34A from the wafer 2, for example as shown in FIG. 14A. On the other hand, when the multi-joint arm section 4 is folded, the eccentric member 31A moves away from the lever 59A so that the lever 59A turns with the biasing force of the tension coil springs 61A to have the roller 34A grasp the wafer 2, for example as shown in FIG. 14B. In FIGS. 14A-14B, the same symbols as those of the embodiment described before are used for functions corresponding to the like functions of this embodiment.

Figure 15A:
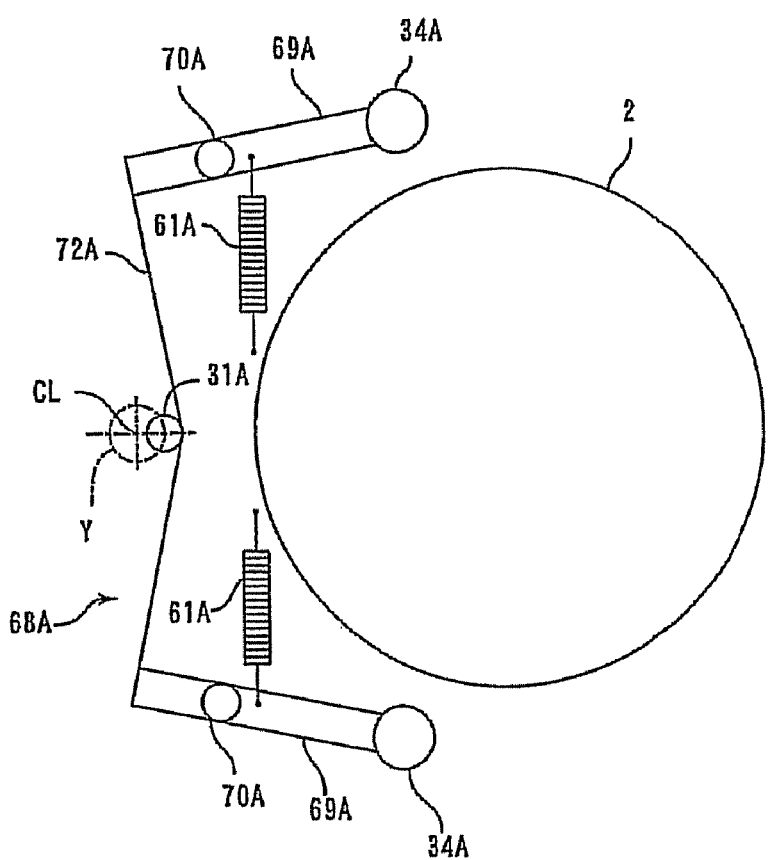
FIGS. 15A-15B illustrate a grasping part in accordance with at least another embodiment of the present invention.
Figure 15B:
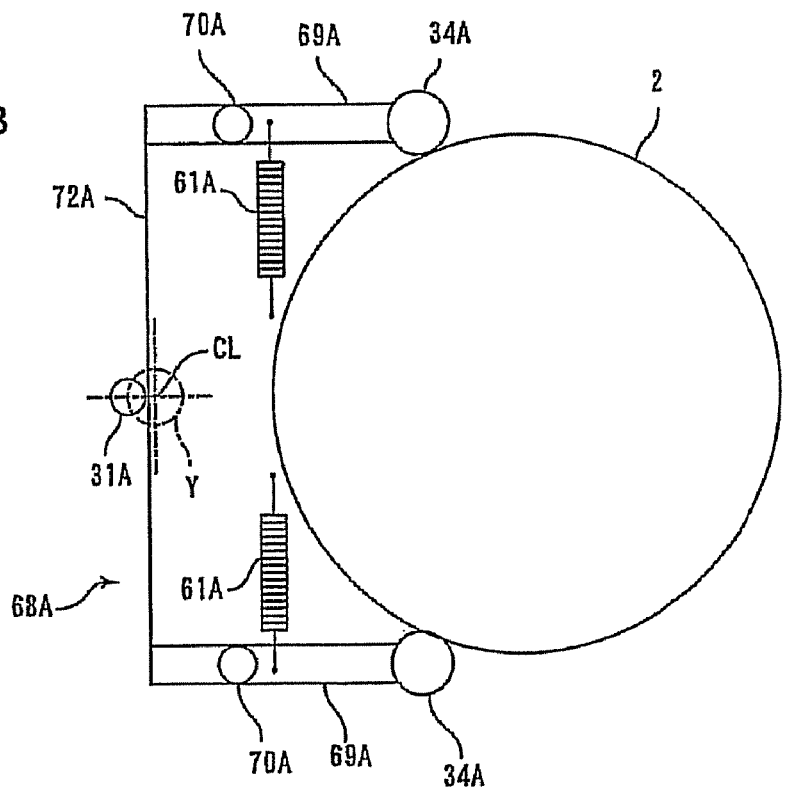

Furthermore, the robot hand 3A may include a grasping part 68A instead of the grasping part 28A, as shown in FIGS. 15A-15B; the grasping part 68A including a couple of levers 69A having the rollers 34A and a line of wire 72A connecting the a couple of levers 69A, and each of the levers 69A turning in relation to a specific axis 70A so as to grasp the wafer 2.

In the grasping part 68A, the lever 69A is formed to be linear and biased in a direction for grasping the wafer 2 by each of the tension coil springs 61A. Furthermore, each of the rollers 34A is placed so as to be rotatable at one end of the lever 69A, and an end of the wire 72A is connected to the other end of the lever 69A. Moreover, the eccentric member 31A contacts the wire 72A so as to have the wire 72A bend. Therefore, with the eccentric member 31A assembled at a specific position of the top end of the fixed shaft 20; when the multi-joint arm section 4 is expanded, the eccentric member 31A contacts the wire 72A to bend the wire 72A so that the lever 69A turns opposing against the biasing force by the tension coil springs 61A to evacuate the roller 34A from the wafer 2, for example as shown in FIG. 15A.

On the other hand, when the multi-joint arm section 4 is folded, the eccentric member 31A moves away from the wire 72A so that the lever 69A turns with the biasing force of the tension coil springs 61A to have the roller 34A grasp the wafer 2, for example as shown in FIG. 15B. Incidentally, a thin-plate-like belt may be used instead of the wire 72A. In FIGS. 15A-15B, the same symbols as those of the embodiment described before are used for functions corresponding to the like functions of this embodiment.

In the embodiment described above, when the multi-joint arm section 4 is folded as shown in FIG. 2B, the grasping part 28A contacts the wafer 2 under a condition where the eccentric member 31A is away from the cam surface 37Aa as shown in FIG. 10C. As another possibility for example; the eccentric member 31A, the cam surface 37Aa, and others may be so structured that, when the multi-joint arm section 4 is folded as shown in FIG. 2B, the grasping part 28A contacts the wafer 2 under a condition where the eccentric member 31A contacts the cam surface 37Aa.

In the embodiment described above, the grasping part 28A is biased in the direction for grasping the wafer 2 by the compression coil springs 29A. As another possibility for example; a grasping part 78A may be biased in a direction for evacuating from the wafer 2 by tension coil springs 79A as a biasing member, as FIGS. 16A-16B shows.

In this case, a spring fixing part 86Aa for fixing one end of each of the tension coil springs 79A is formed at a shaft 86A and the one end of the tension coil spring 79A is fixed to the spring fixing part 86Aa, while the other end of the tension coil spring 79A is fixed to the slide bearing 38A placed at a root side. Furthermore, in this case, the roller 34A is assembled at a top end of the shaft 86A while having a compression coil spring 87A between the roller 34A and the top end of the shaft 86A. In FIGS. 16A-16B, the same symbols as those of the embodiment described before are used for functions corresponding to the like functions of this embodiment.

Figure 16A:
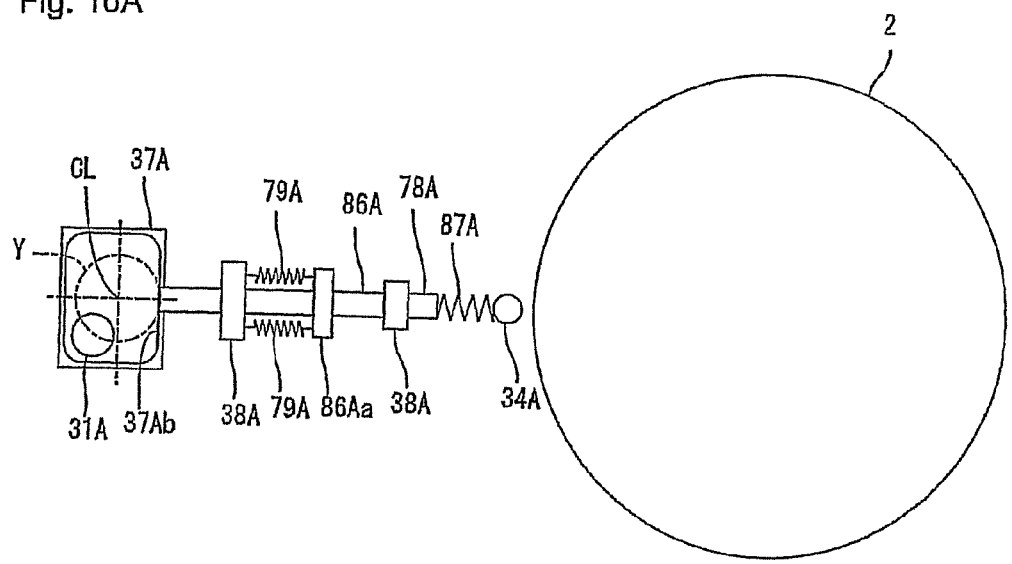
FIGS. 16A-16B illustrate a grasping part in accordance with at least another embodiment of the present invention.
Figure 16B:
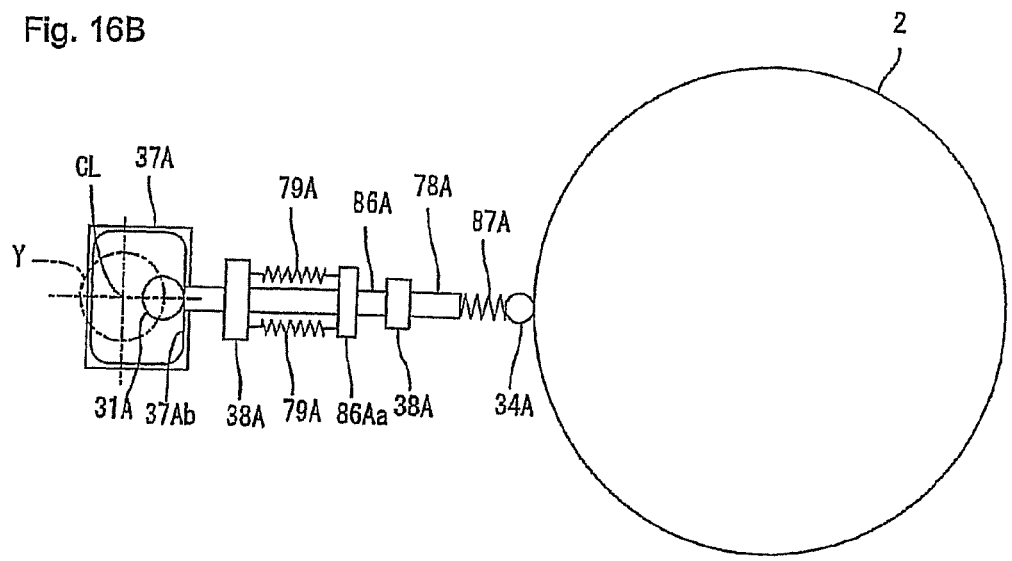

In the embodiment described above, when the multi-joint arm section 4 is expanded, the eccentric member 31A is away from the internal surface of the cam part 37A, as shown in FIG. 16A. Contrarily, when the multi-joint arm section 4 is folded, the eccentric member 31A contacts a cam surface 37Ab, which is a right side internal surface of the cam part 37A in FIGS. 16A-16B, as shown in FIG. 16B. The eccentric member 31A is so assembled at a specific position of the top end of the fixed shaft 20 as to enable the movement described above.

Therefore, when the multi-joint arm section 4 is expanded, the roller 34A is evacuated from the wafer 2 with the biasing force of the tension coil springs 79A. Contrarily, when the multi-joint arm section 4 is folded, the eccentric member 31A contacts the cam surface 37Ab so that the grasping part 78A moves in a direction for grasping the wafer 2 so as to grasp the wafer 2. When the multi-joint arm section 4 gets folded from an expanded condition, the eccentric member 31A moves counterclockwise in FIGS. 16A-16B along the virtual circle 'Y' in comparison with the grasping part 78A so as to contact the cam surface 37Ab. Contrarily, when the multi-joint arm section 4 gets expanded from a folded condition, the eccentric member 31A moves clockwise in FIGS. 16A-16B along the virtual circle 'Y' in comparison with the grasping part 78A so as to get detached from the cam surface 37Ab.

Also in this case, in the same way as described before for the above embodiment; at the time of decelerating motion of the multi-joint arm section 4 when the multi-joint arm section 4 gets folded, the grasping part 78A contacts the wafer 2 with the motion of the eccentric member 31A contacting the cam surface 37Ab so as to start grasping the wafer 2. Contrarily, at the time of accelerating motion of the multi-joint arm section 4 when the multi-joint arm section 4 gets expanded, the grasping part 78A is evacuated with the biasing force of the tension coil springs 79A.

Even in the case of structuring as FIGS. 16A-16B show, at the time of taking out the wafer 2, motion speed of the grasping part 78A can be controlled by the eccentric member 31A for a comparatively long time from starting the expanding/folding motion of the multi-joint arm section 4 until the time of deceleration in the expanding/folding motion of the multi-joint arm section 4. Therefore, the wafer 2 can be grasped by having the grasping part 78A contact the wafer 2 slowly. As a result, the physical impact given onto the wafer 2 can be reduced.

Furthermore, in the first embodiment described above, the biasing member that biases the grasping part 28A in the direction for grasping the wafer 2 is prepared with the compression coil springs 29A. However, the biasing member that biases the grasping part 28A may be prepared with another type of spring material such as a leaf spring, or an elastic material such as rubber.

Second Embodiment

At least a second embodiment of the present invention is described below with reference to the accompanying drawings. Incidentally, the same symbols as those of the first embodiment described before are used for functions corresponding to the like functions of the second embodiment.
(Schematic View of Industrial Robot)

Figure 17A:
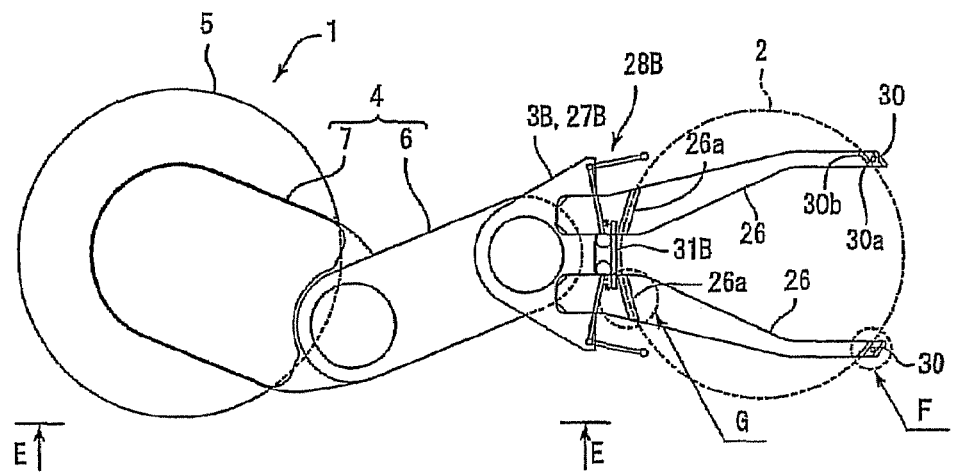
Figure 17B:
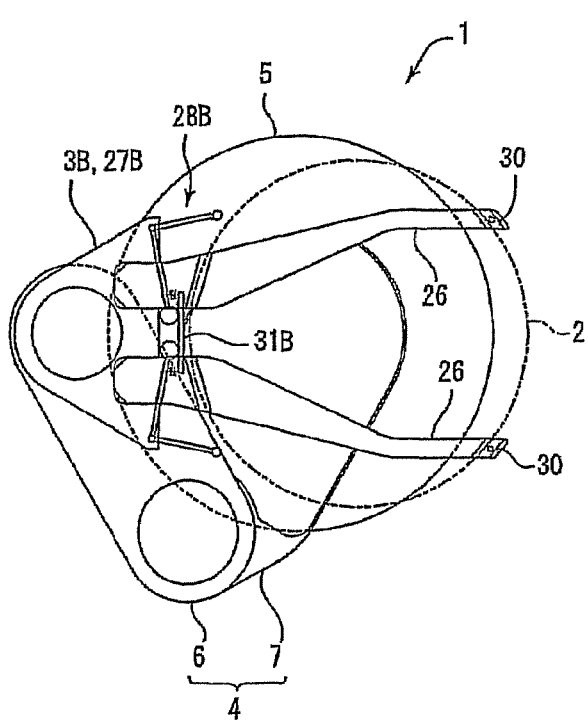

FIG. 1 is a side view showing an industrial robot 1 according to at least an embodiment of the present invention. FIGS. 17A-17B are plan views of the industrial robot 1 shown in FIG. 1, wherein FIG. 17A illustrates a posture in which a multi-joint arm section 4 is expanded and FIG. 17B illustrates another posture in which the multi-joint arm section 4 is folded. FIG. 3 is a plan view showing a schematic view of a semiconductor manufacturing system 9 in which the industrial robot 1 shown in FIG. 1 is built. FIG. 4 is a schematic sectional view for describing a power transmission mechanism inside the multi-joint arm section 4 and a robot hand 3B, both of which are shown in FIG. 1. FIGS. 18A-18D illustrate a relationship between the expanding/folding condition of the multi-joint arm section 4, shown in FIG. 1, and the orientation of the robot hand 3B. FIG. 11 is a drawing that describes a relationship between a speed of the driving motor for the hollow turning shaft 16 and a rotation angle of the first arm 7 when the robot 1 shown in FIG. 1 takes out and brings in the wafer 2. Meanwhile, FIG. 4 is a schematic sectional view of the multi-joint arm section 4 and others when these parts are viewed in a direction of 'E-E' indicated in FIG. 17A.

The industrial robot 1 of the present embodiment (hereinafter, called as 'the robot 1') transfers a thin disc-shaped semiconductor wafer 2 (hereinafter, called as 'the wafer 2') as a transfer object. As shown in FIG. 1 and FIGS. 17A-17B, the robot 1 includes: the robot hand 3B for loading the wafer 2 on it; the multi-joint arm section 4, which supports the robot hand 3B so as to keep it rotatable, and is expanded and folded when transferring the wafer 2; and a main section 5 that supports the multi-joint arm section 4 so as to keep it rotatable. The multi-joint arm section 4 of the present embodiment is composed of two robot arms; i.e., a second arm 6 and a first arm 7.

The robot 1 of the present embodiment is built in the semiconductor manufacturing system 9 for its use, as shown in FIG. 3 for example.

The semiconductor manufacturing system 9 shown in FIG. 3 is the same as that of the first embodiment described above, and it is not described here in detail again. In the second embodiment; to bring in the wafer 2, the folded multi-joint arm section 4 gets expanded so that the robot hand 3B passes through the gate to enter an internal part of the delivery chamber 10 or processing chamber 11. Meanwhile, to take out the wafer 2, the multi-joint arm section 4 being expanded and placed in the delivery chamber 10 or processing chamber 11 now gets folded so that the robot hand 3B passes through the gate to return to an internal part of the transfer chamber 12.

As FIGS. 1 and 17 show, a root end of the robot hand 3B is connected to a top end of the second arm 6 while being rotatable. A root end of the second arm 6 is connected to a top end of the first arm 7 while being rotatable. A root end of the first arm 7 is connected to the main section 5 while being rotatable. Furthermore, in the vertical direction; the robot hand 3B, the second arm 6, the first arm 7, and the main section 5 are positioned in this order from the top toward the bottom. In the present embodiment, the second arm 6 works as a hand supporting arm that supports the robot hand 3B at a top end of the arm so as to keep the robot hand 3B rotatable.

Descriptions on FIG. 4 are the same as those of the first embodiment described above, and are not given here in detail again. In the second embodiment; at a bottom surface of the root side of the robot hand 3B, a pulley 22 is fixed. Then, the pulley 22 is positioned inside the internal space at the top end of the second arm 6. The fixed shaft 20 is inserted through the pulley 22, which is rotatable in relation to the fixed shaft 20. A belt 23 is placed between the pulley 22 and the first pulley section 19a to connect the two pulleys.

A structure of the robot hand 3B is described later in detail.

In the present embodiment; if the hollow turning shaft 16 rotates while the solid turning shaft 15 being fixed, the multi-joint arm section 4 is expanded and folded. In other words, when the driving motor for the hollow turning shaft 16 drives under a prescribed condition, the multi-joint arm section 4 takes actions of expanding and folding. Meanwhile, if both the solid turning shaft 15 and the hollow turning shaft 16 rotate together as a whole, the multi-joint arm section 4 takes no action of expanding and folding but the multi-joint arm section 4 rotates in relation to the main section 5. In other words, when the driving motor for the solid turning shaft 15 drives under a prescribed condition, the multi-joint arm section 4 takes actions of rotating.

In the present embodiment; a distance between the pulley 17 and the pulley 19 is equal to a distance between the pulley 19 and the pulley 22. Meanwhile, a ratio of diameters of the pulley 17 and the second pulley section 19b is 2:1, and a ratio of diameters of the first pulley section 19a and the pulley 22 is 1:2. As a result, in the present embodiment; if the hollow turning shaft 16 rotates while the solid turning shaft 15 being fixed as shown in FIGS. 18A-18D, an angle formed by the robot hand 3B and the second arm 6 as well as another angle formed by the second arm 6 and the first arm 7 both change. However, under the condition, the robot hand 3B moves along a virtual line 'X' stretched from the center of the pulley 17 (i.e., the center of the main section 5) to the center of the pulley 22 (i.e., the turning center of the robot hand 3B) while keeps the orientation of the robot hand 3B unchanged. The robot 1 according to at least an embodiment of the present invention is a so-called cylindrical robot that moves in a radial direction while keeping the orientation of the robot hand 3B unchanged when the multi-joint arm section 4 is expanded and folded.

Figure 18A:
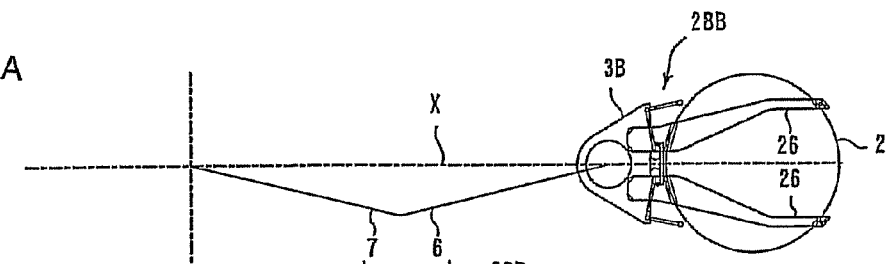
FIGS. 18A-18D illustrate a relationship between the expanding/folding condition of the multi-joint arm section, shown in FIG. 1, and the orientation of the robot hand.
Figure 18B:
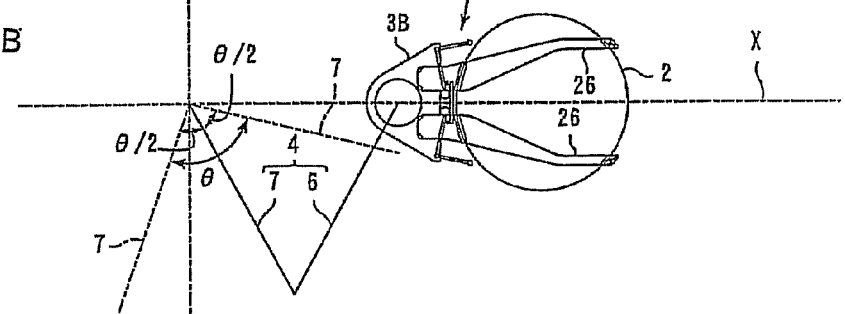
Figure 18C:
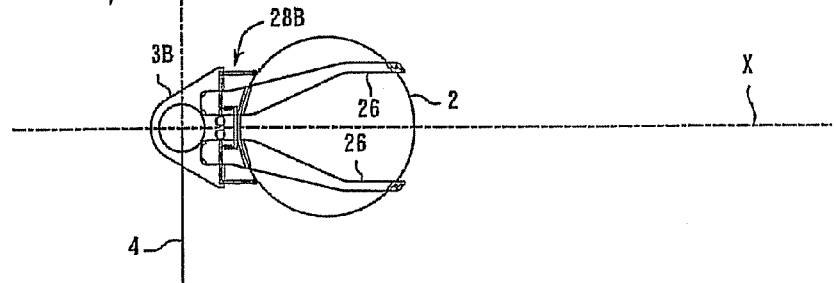
Figure 18D:
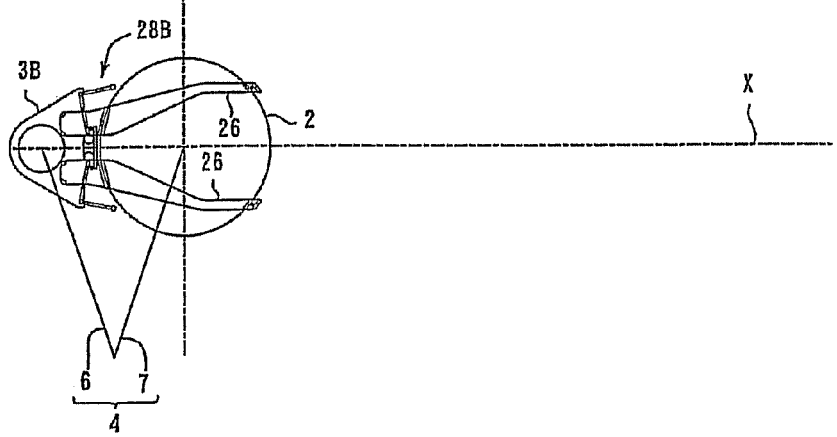

FIG. 18A shows a condition in which the multi-joint arm section 4 is fully expanded, and an operation of taking out the wafer 2 from one of the delivery chambers 10 or processing chambers 11 starts under the condition. Meanwhile, FIG. 18D shows another condition in which the multi-joint arm section 4 is fully folded, and an operation of bringing the wafer 2 into one of the delivery chambers 10 or processing chambers 11 starts under the condition. Furthermore, FIG. 18B shows still another condition in which the multi-joint arm section 4 is just halfway in the expanding/folding motion. In other words; where the angle formed by turning motion of the first arm 7, while the multi-joint arm section 4 executes the folding motion from the condition shown in FIG. 18A to the condition shown in FIG. 18D, is represented as a rotation angle 'θ'; FIG. 18B shows the other condition in which an angle formed by the first arm 7 of FIG. 18A and that of FIG. 18B (or an angle formed by the first arm 7 of FIG. 18D and that of FIG. 18B) is 'θ/2'. Moreover, FIG. 18C shows a condition in which the turning center of the robot hand 3B coincides with the center of the main section 5.

According to the second embodiment; in the case of taking out or bringing in the wafer 2, the turning speed (RPM) of the driving motor for the hollow turning shaft 16 changes as FIG. 11 shows. Namely, after having accelerated, the driving motor for the hollow turning shaft 16 decelerates without any constant-speed operation. In other words, the expanding/folding motion of the multi-joint arm section 4 according to the turning operation of the hollow turning shaft 16 includes only accelerating and decelerating motion without any constant-speed operation.

Furthermore, in the present embodiment; an accelerating rate and a decelerating rate of the driving motor for the hollow turning shaft 16 are the same each other. Then, the accelerating and decelerating motion of the driving motor for the hollow turning shaft 16 is switched at the timing of the condition shown in FIG. 18B. In other words, the acceleration and deceleration of the expanding/folding motion of the multi-joint arm section 4 is switched when the first arm 7 has turned for 'θ/2' after a start of taking out or bringing in the wafer 2.

Structure of Robot Hand of the Second Embodiment

Figure 19A:
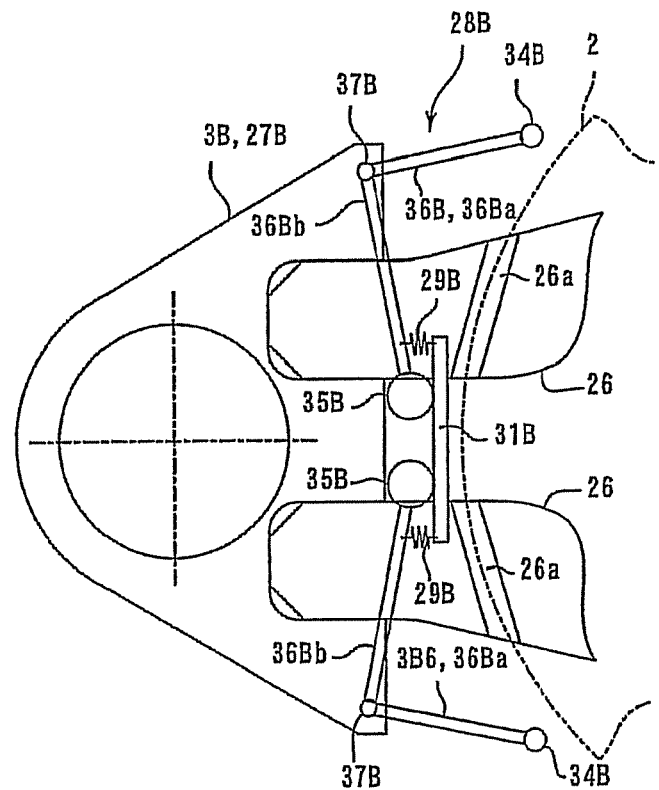
Figure 19B:
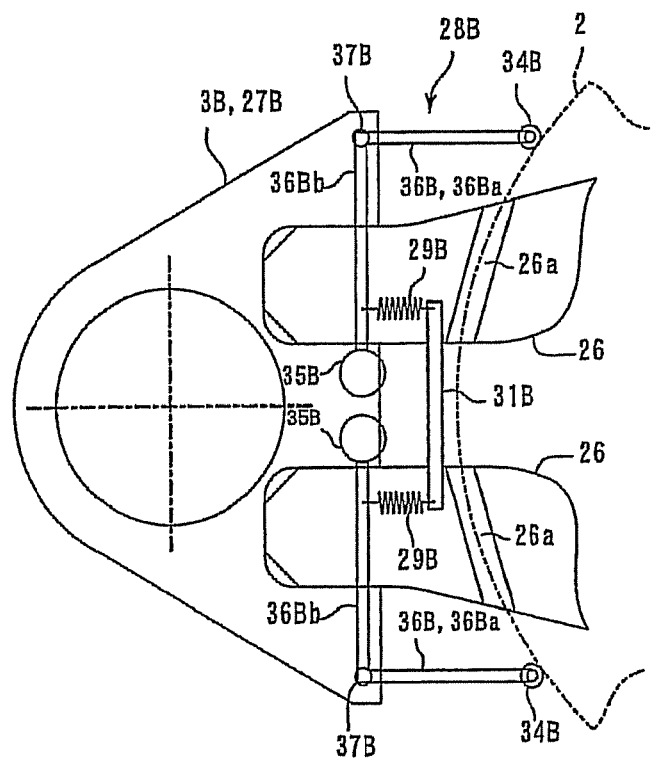

FIGS. 19A-19B are plan views showing a key section of the robot hand 3B illustrated in FIG. 1; wherein FIG. 19A shows a condition where a grasping part 28B is evacuated from the wafer 2 and FIG. 19B shows another condition where the grasping part 28B is grasping the wafer 2. FIG. 20 is a side view of the key section of the robot hand 3B illustrated in FIGS. 19A-19B. FIG. 7 is a sectional view describing a structure of a section 'F' shown in FIG. 17A in a view from a sectional direction. FIG. 8 is a sectional view describing a structure of a section 'G' shown in FIG. 17A in a view from a sectional direction. In the following descriptions, the vertical direction in FIG. 7 is dealt with as a cross direction, while the horizontal direction in FIGS. 19A-19B is dealt with as a longitudinal direction, as a matter of convenience.

As shown in FIGS. 19A-19B and other drawings, the robot hand 3B includes: two mounting members 26 for mounting the wafer 2; a base 27B to which root sides of the two mounting members 26 are fixed; the grasping part 28B for grasping the wafer 2 by contacting an edge of the wafer 2; tension coil springs 29B as biasing members that bias the grasping part 28B in a direction for evacuating from the wafer 2; contacting members 30 as contacting sections that edges of the wafer 2 contact; and a restriction member 31B that controls the motion of the grasping part 28B in the biasing direction by the tension coil springs 29B.

The mounting members 26 are thin plate members, for example, formed with ceramic. As described above, the root sides of the two mounting members 26 are fixed to the base 27B. Specifically, as shown in FIG. 2 and other drawings, the root sides of the two mounting members 26 are fixed to the base 27B while the two members having a prescribed space between them in a cross direction and being almost parallel to each other. Formed at a root end of each of the mounting members 26 is a slope 26a, which a bottom corner of an edge of the wafer 2 contacts. Concretely to describe; as shown in FIG. 8, the slope 26a is so formed as to gently descend in a direction toward the top end of each mounting member 26. Furthermore, as shown in FIG. 17A; when being seen in the plan view of the drawing, the slope 26a is so formed as to become almost parallel to a tangential line at a contact point of the wafer 2 contacting the slope 26a.

Each of the contacting members 30 is fixed at a top position of each of the two mounting members 26. Formed at each contacting member 30 are a vertical surface 30a which an edge of the wafer 2 contacts, and a slope 30b which a bottom corner of the edge of the wafer 2 contacts, as shown in FIG. 7. The slope 30b is so formed from a lower end of the vertical surface 30a toward the root end of the robot hand 3B as to gently descend in a direction toward the root end of the robot hand 3B. Furthermore, as shown in FIG. 17A; when being seen in the plan view of the drawing, the vertical surface 30a and the slope 30b are so formed as to become almost parallel to a tangential line at a contact point of the wafer 2 contacting the slope 30b.

As described later, the vertical surface 30a works together with the grasping part 28B for grasping the wafer 2. Furthermore, as described later, the vertical surface 30a works for preventing the wafer 2 from getting dislocated when the wafer 2 is taken out and brought in.

The base 27B is included in the root side part of the robot hand 3B. The pulley 22 is fixed to a bottom surface of the base 27B.

The grasping part 28B is positioned at the root side of the robot hand 3B. Specifically, the grasping part 28B is assembled onto a top surface of the base 27B. As shown in FIGS. 19A-19B and others, the grasping part 28B includes: two rollers 34B that contact the wafer 2 and are rotatable; two weight components 35B that move the rollers 34B in a direction for the rollers 34B to contact the wafer 2 by an inertia force accompanying the expanding/folding motion of the multi-joint arm section 4; two levers 36B connecting each of the rollers 34B and each of the weight components 35B; two fixed shafts 37B that support the levers 36B to keep them rotatable. Each of the two rollers 34B, two weight components 35B, two levers 36B, and two fixed shafts 37B is positioned symmetrically with respect to the center line of the robot hand 3B in the longitudinal direction. In the present embodiment, the rollers 34B are grasping members that contact the wafer 2 as a transfer object and grasp the wafer 2.

The two fixed shafts 37B are individually fixed at positions that are located at forefronts and right/left ends of the base 27B, as shown in FIGS. 19A-19B. In other words, the two fixed shafts 37B are fixed at the forefront positions of the base 27B while having a specific distance in the cross direction. Furthermore, as shown in FIG. 20, the fixed shafts 37B are fixed onto the base 27B so as to protrude from a top surface of the base 27B.

Each of the levers 36B is formed to be almost L-shaped. Concretely to describe, the lever 36B includes a first lever part 36Ba and a second lever part 36Bb that are almost linear each and connected to be almost perpendicular to each other. As described above, the lever 36B is supported to be rotatable by each of the fixed shafts 37B. Specifically, a part connecting the first lever part 36Ba and second lever part 36Bb is supported to be rotatable by the fixed shaft 37B. Furthermore, the lever 36B is supported to be rotatable by the fixed shaft 37B in such a way that; a length direction of the first lever part 36Ba generally lies in the longitudinal direction; a length direction of the second lever part 36Bb generally lies in the cross direction; the first lever part 36Ba extends from the fixed shaft 37B toward the front side; and the second lever part 36Bb extends from the fixed shaft 37B toward the inside in the cross direction.

Each of the rollers 34B is assembled at one end of the lever 36B. Specifically, the roller 34B is assembled at the top end of the first lever part 36Ba to be rotatable.

Each of the weight components 35B is a weight piece made of a metal or equivalent that has a high specific gravity. The weight component 35B of the present embodiment is formed to be almost disk-like. The weight component 35B is assembled at the other end of the lever 36B (the counter end from the end for the roller 34B). Specifically, the weight component 35B is assembled at the top end of the second lever part 36Bb.

The restriction member 31B is formed to be plate-like, and placed to be parallel to a plain made with the longitudinal direction and cross direction. Specifically, the restriction member 31B is fixed onto the upper surface of the two mounting members 26 at their root side. In the present embodiment, the restriction member 31B is placed at a position closer to the top end of the robot hand 3B in relation to the weight components 35B fixed to the levers 36B. Furthermore, the restriction member 31B is so placed that the weight components 35B can contact the restriction member 31B; the weight components 35B turning together with the levers 36B in relation to the fixed shafts 37B as turning centers. Namely, in the present embodiment, the motion of the grasping part 28B implemented by each of the tension coil springs 29B in the biasing direction is controlled, while each of the weight components 35B contacts the restriction member 31B.

As FIGS. 19A-19B show, one end of each of the tension coil springs 29B is connected to the restriction member 31B, while the other end of the tension coil spring 29B is connected to the top side of the second lever part 36Bb. Therefore, as described above, the grasping part 28B (specifically, the roller 34B) is biased by the tension coil spring 29B in a direction for evacuating from the wafer 2. Concretely to describe, one lever 36B positioned at the upper side in FIGS. 19A-19B and the other lever 36B positioned at the lower side in the same are biased in the counterclockwise direction and the clockwise direction, respectively.

In the present embodiment; length of the second lever part 36Bb, weight of the weight component 35B, a biasing force of the tension coil spring 29B are so adjusted that the roller 34B moves in a direction for contacting the wafer 2 by an inertia force accompanying the expanding/folding motion of the multi-joint arm section 4, as described below.

As FIG. 19A shows; under a normal condition in the present embodiment, the grasping part 28B is evacuated from the wafer 2 with the biasing force of the tension coil spring 29B so that the roller 34B does not contact the wafer 2. Namely, the wafer 2 is released from the grasping part 28B. At the time, the weight component 35B contacts the restriction member 31B so that the motion of the grasping part 28B is restricted.

On the other hand, when the multi-joint arm section 4 gets folded from an expanded condition for taking out the wafer 2 from the delivery chamber 10 or processing chamber 11 and the expanding/folding motion of the multi-joint arm section 4 gets into decelerating condition, an inertia force being relative to the base 27B occurs on the weight component 35B in a direction toward the root side of the robot hand 3B. As a result, the lever 36B turns in a direction for the roller 34B to grasp the wafer 2, while opposing against the biasing force by the tension coil spring 29B, as FIG. 19B shows. In other words, at the time of deceleration in the expanding/folding motion of the multi-joint arm section 4 for taking out the wafer 2, the weight component 35B moves the roller 34B in the direction for the roller 34B to contact the wafer 2 by the inertia force. If the lever 36B turns while opposing against the biasing force by the tension coil spring 29B, the roller 34B contacts the wafer 2 to grasp the wafer 2. When the multi-joint arm section 4 stops after getting folded, the roller 34B releases the wafer 2 with the biasing force by the tension coil spring 29B, as described above.

In a similar way, when the multi-joint arm section 4 gets expanded from a folded condition for bringing the wafer 2 into the delivery chamber 10 or processing chamber 11, an inertia force being relative to the base 27B occurs on the weight component 35B in a direction toward the root side of the robot hand 3B at the time of acceleration in the expanding/folding motion of the multi-joint arm section 4. As a result, the lever 36B turns in a direction for the roller 34B to grasp the wafer 2, while opposing against the biasing force by the tension coil spring 29B. In other words, at the time of acceleration in the expanding/folding motion of the multi-joint arm section 4 for bringing in the wafer 2, the weight component 35B moves the roller 34B in the direction for the roller 34B to contact the wafer 2 by the inertia force. If the lever 36B turns while opposing against the biasing force by the tension coil spring 29B, the roller 34B contacts the wafer 2 to grasp the wafer 2. When the multi-joint arm section 4 stops after getting expanded, the roller 34B releases the wafer 2 with the biasing force by the tension coil spring 29B.

Incidentally, when the grasping part 28B grasps the wafer 2, the vertical surfaces 30a of the contacting members 30 also contact the wafer 2. Namely, the wafer is grasped by the grasping part 28B and the vertical surfaces 30a together. In the present embodiment; being laid out at almost 120-degree pitch intervals as shown in FIGS. 17A-17B, the grasping part 28B and the vertical surfaces 30a contact and grasp the wafer 2.

At the time of accelerating motion of the multi-joint arm section 4 for taking out the wafer 2, a relative inertia force occurs on the wafer 2 in a direction toward the top side of the robot hand 3B. Furthermore, at the time of decelerating motion of the multi-joint arm section 4 for bringing in the wafer 2, a relative inertia force also occurs on the wafer 2 in a direction toward the top side of the robot hand 3B. Therefore, in those cases, the wafer 2 contacts the vertical surfaces 30a of the contacting members 30 to prevent the wafer 2 itself from dislocation.

At the time of accelerating motion of the multi-joint arm section 4 for taking out the wafer 2 as well as decelerating motion of the multi-joint arm section 4 for bringing in the wafer 2, an inertia force being relative to the base 27B occurs on the weight component 35B in a direction toward the top side of the robot hand 3B. At the time, the weight component 35B contacts the restriction member 31B so that the motion of the grasping part 28B is restricted.

Advantageous Effect of the Second Embodiment

According to the present embodiment as described above; the robot hand 3B includes the grasping part 28B for grasping the wafer 2 by contacting the same, and the tension coil springs 29B for biasing the grasping part 28B in the direction for evacuation from the wafer 2. Furthermore, the grasping part 28B includes the rollers 34B that contact and grasp the wafer 2, and the weight components 35B that move the rollers 34B in the direction for the rollers 34B to contact the wafer 2 by the inertia force accompanying the expanding/folding motion of the multi-joint arm section 4. Therefore, the wafer 2 can be grasped by a simple construction including the rollers 34B and the weight components 35B, and it can also be released by a simple construction including the tension coil springs 29B.

According to the present embodiment, the grasping part 28B is positioned at the root side of the robot hand 3B, and the contacting members 30 are fixed at the top positions of the mounting members 26 located at the top side of the robot hand 3B. At the time of deceleration in the expanding/folding motion of the multi-joint arm section 4 for taking out the wafer 2, the weight components 35B move the rollers 34B in the direction for contacting the wafer 2. Therefore, at the time of deceleration in the expanding/folding motion of the multi-joint arm section 4 for taking out the wafer 2, the rollers 34B can prevent the wafer 2 from dislocation. Meanwhile, at the time of acceleration in the expanding/folding motion of the multi-joint arm section 4 for taking out the wafer 2, the contacting members 30 (specifically, the vertical surfaces 30a) can prevent the wafer 2 from dislocation.

According to the present embodiment, at the time of acceleration in the expanding/folding motion of the multi-joint arm section 4 for bringing in the wafer 2, the weight components 35B move the rollers 34B in the direction for the rollers 34B to contact the wafer 2. Therefore, at the time of acceleration in the expanding/folding motion of the multi-joint arm section 4 for bringing in the wafer 2, the rollers 34B can prevent the wafer 2 from dislocation. Meanwhile, at the time of deceleration in the expanding/folding motion of the multi-joint arm section 4 for bringing in the wafer 2, the contacting members 30 (specifically, the vertical surfaces 30a) can prevent the wafer 2 from dislocation.

According to the present embodiment, the robot hand 3B includes the restriction member 31B that controls the motion of the grasping part 28B in the biasing direction by the tension coil springs 29B. Therefore, when the grasping part 28B is evacuated from the wafer 2 (namely, when the wafer 2 is released), the positions of the weight components 35B can be controlled by the restriction member 31B. Consequently, it becomes possible to appropriately apply the inertia force, accompanying the expanding/folding motion of the multi-joint arm section 4, onto the weight components 35B so as to turn the levers 36B rightly. As a result, the rollers 34B can contact the wafer 2 for sure.

According to the present embodiment, one end of each of the levers 36B, formed to be almost L-shaped, is equipped with each of the roller 34B while the other end of the same is equipped with each of the weight components 35B. Therefore, the roller 34B can be moved with the inertia force in the direction for contacting the wafer 2 by a simple construction including the lever 36B that turns in relation to the fixed shaft 37B as a turning center.

According to the present embodiment, the grasping part 28B includes the rollers 34B that contact the wafer 2 and are rotatable. Therefore, even if the wafer 2 is dislocated on the robot hand 3B at the time when the grasping part 28B contacts the wafer 2, the wafer 2 can be positioned at a specific place by the action of the rollers 34B without causing any damage to the wafer 2.

Other Embodiments of the Second Embodiment

The second embodiment described above is an example of a preferred embodiment in accordance with at least an embodiment of the present invention, but at least an embodiment of the present invention is not limited to the above embodiment and various variations may be made without changing the concept of the present invention.

Figure 21A:
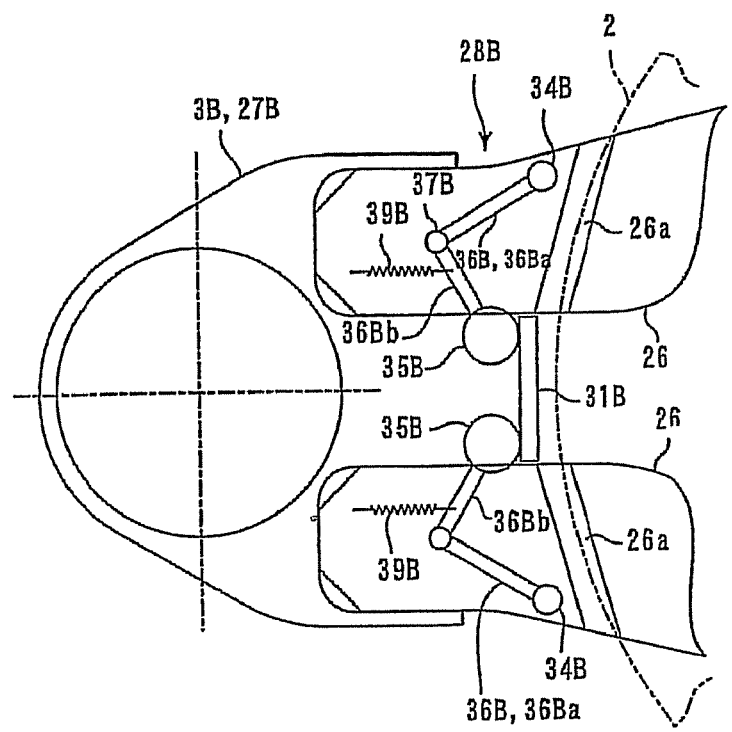
FIGS. 21A and 21B illustrate biasing members in accordance with at least another embodiment of the present invention.
Figure 21B:
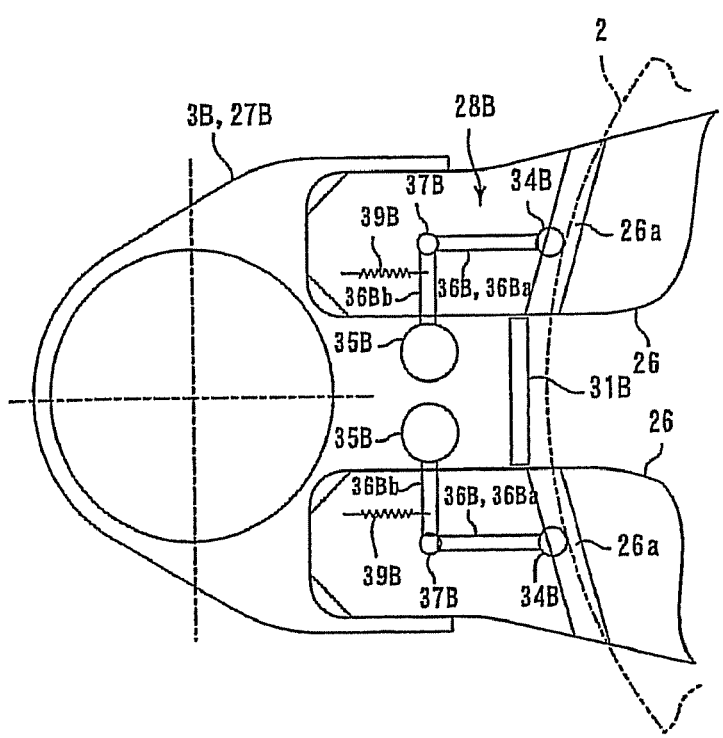

According to the embodiment described above, the grasping part 28B is biased by the tension coil springs 29B in the direction for evacuating from the wafer 2. As another possibility for example; the grasping part 28B may be biased in a direction for evacuating from the safer 2 by compression coil springs 39B as biasing members, as shown in FIGS. 21A-21B. In this case, one end of each of the compression coil springs 39B is connected to the second lever part 36Bb while the other end of the compression coil spring 39B is connected to each of the mounting members 26 (or, the base 27B), as shown in FIGS. 21A-21B. In FIGS. 21A-21B, the same symbols as those of the embodiment described above are used for functions corresponding to the like functions of this embodiment.

According to the embodiment described above, the robot hand 3B includes the grasping part 28B that grasps and releases the wafer 2 by turning the two levers 36B formed to be almost L-shaped. As another possibility for example; the robot hand 3B may include a grasping part 48B instead of the grasping part 28B, as shown in FIGS. 22A-22B; the grasping part 48B including weight components 45B, each of which is fixed to each of belts 41B, and rollers 34B, each of which is assembled onto the belt 41B by means of each of holding members 42B; and the rollers 34B moving linearly to grasp and release the wafer 2.

In the grasping part 48B, the belt 41B is stretched between two pulleys 43B for example. Each of the rollers 34B is assembled to be rotatable at the top end of the holding member 42B. One end of each of tension coil springs 49B is fixed to the rear end of the holding member 42B while the other end of the tension coil spring 49B is fixed to the base 27B. In a similar way as described for the embodiment above; under a normal condition, the grasping part 48B is evacuated from the wafer 2 by the biasing force of the tension coil spring 49B, as shown in FIG. 22A. At the time of deceleration in the expanding/folding motion of the multi-joint arm section 4 for taking out the wafer 2 or acceleration in the expanding/folding motion of the multi-joint arm section 4 for bringing in the wafer 2, the grasping part 48B grasps the wafer 2 with the rollers 34B by an inertia force, as shown in FIG. 22B. In FIGS. 22A-22B, the same symbols as those of the embodiment described above are used for functions corresponding to the like functions of this embodiment.

Figure 22A:
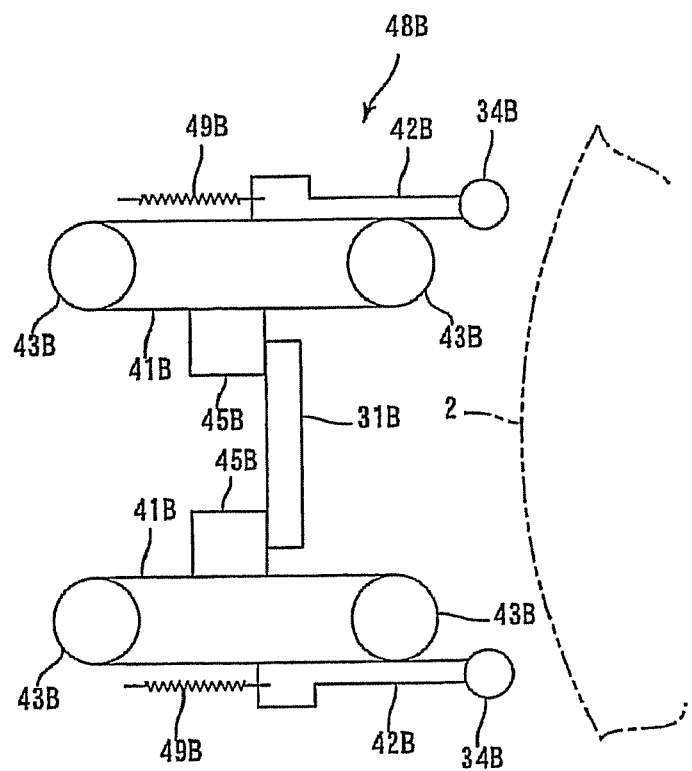
FIGS. 22A and 22B illustrate a grasping part in accordance with at least another embodiment of the present invention.
Figure 22B:
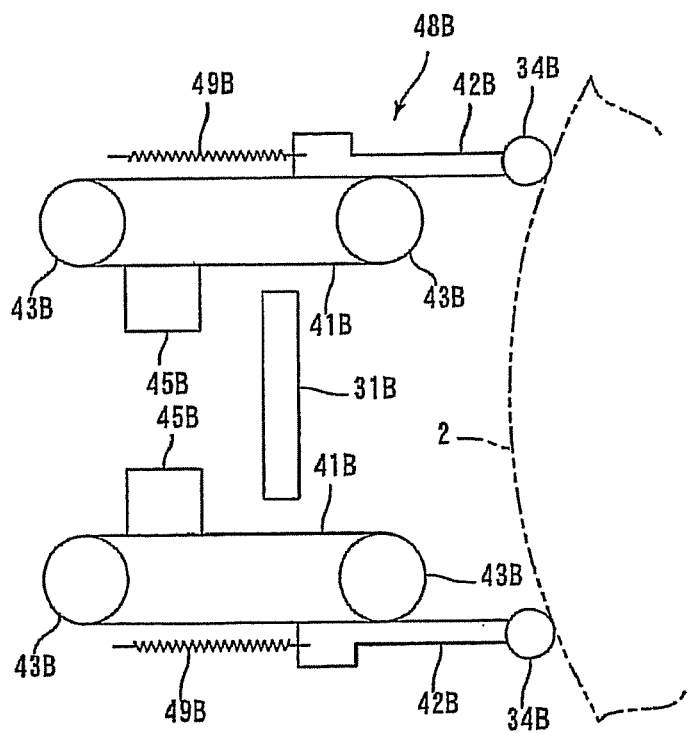

Furthermore, a linear guide may be used instead of a combination of the belt 41B and the pulleys 43B in the grasping part 48B shown in FIGS. 22A-22B.

In the second embodiment described above, the expanding/folding motion of the multi-joint arm section 4 according to the turning operation of the hollow turning shaft 16 includes only accelerating and decelerating motion without any constant-speed operation. As another possibility for example; the expanding/folding motion of the multi-joint arm section 4 according to the turning operation of the hollow turning shaft 16 may include a constant-speed operation in addition to the accelerating motion and decelerating motion.

Furthermore, though the accelerating rate and decelerating rate of the driving motor for the hollow turning shaft 16 are the same each other in the embodiment described above, the accelerating rate and decelerating rate of the driving motor for the hollow turning shaft 16 may be different each other.

In the second embodiment described above, the rollers 34B are the grasping members that contact the wafer 2 as a transfer object and grasp the wafer 2. As another possibility for example; the grasping members that contact and grasp the wafer 2 may be immovable members, each of which is fixed at one end of the lever 36B. Furthermore, in the embodiment described above, the biasing member that biases the grasping part 28B in the direction for grasping the wafer 2 is prepared with the tension coil springs 29B. However, the biasing member that biases the grasping part 28B may be prepared with another type of spring material such as a leaf spring, or an elastic material such as rubber.

In the second embodiment described above, the motion of the grasping part 28B in the direction of biasing the grasping part 28B with the compression coil springs 39B is controlled by having the weight components 35B contact the restriction member 31B. As another possibility for example; the motion of the same may by controlled by having the levers 36B contact the restriction member 31B.

In the first and second embodiments described above, the robot 1 is a so-called cylindrical robot that moves in a radial direction while keeping the orientation of the robot hand 3A or 3B unchanged when the multi-joint arm section 4 is expanded and folded. As another possibility for example; the robot, to which the construction of at least an embodiment of the present invention is applied, may be a different type of robot other than such a cylindrical robot. Namely, the construction of at least an embodiment of the present invention may be applied also to a robot in which the orientation of the robot hand 3A or 3B changes when the multi-joint arm section 4 is expanded and folded. Furthermore, though the multi-joint arm section 4 includes two arms, i.e., the second arm 6 and the first arm 7 in the embodiment described above, the multi-joint arm section 4 may include three arms or more.

In the first and second embodiments described above, the contacting members 30 are formed separately from the mounting members 26 and fixed to the mounting members 26. However, another type of contacting members having the same function, as the contacting members 30 have, may be formed as integrated units in the mounting members 26.

The robot 1 in the first and second embodiments described above is a so-called vacuum robot to be used under vacuum. However, the robot 1 may be used in the atmosphere. In other words; the robot, to which the construction of at least an embodiment of the present invention is applied, is not limited to a vacuum robot. Furthermore, a transfer object to be transferred by the robot 1 in the embodiment described above is the wafer 2, i.e., a disk-like piece. However, the transfer object to be transferred by the robot 1 may be a substrate formed to be disk-like, instead of the wafer 2, or any other material such as a substrate formed to be polygonal such as rectangular, etc.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. An industrial robot, for taking out a transfer object from a storage section where the transfer object is stored and bringing the transfer object into the storage section, the industrial robot comprising:
    a robot hand structured to mount the transfer object;
    a multi-joint arm section having at least two arms including a robot hand supporting arm structured to support the robot hand to be rotatable at a top side, the multi-joint arm section expanding/folding at the time of taking out and bringing in the transfer object from/to the storage section;
    a main section structured to support the multi-joint arm section to be rotatable;
    wherein the robot hand comprises:
        a grasping part structured to contact and grasp the transfer object; and
        a biasing member structured to bias the grasping part in a direction for grasping the transfer object; and
    the robot hand supporting arm comprises:
        a member fixed to the robot hand supporting arm at a position being remote from a turning center of the robot hand in relation to the hand supporting arm, the member contacting the grasping part so as to evacuate the grasping part from the transfer object before starting operation of taking out the transfer object from the storage section;
        wherein the member moves in comparison with the grasping part according to the expanding/folding motion of the multi-joint arm section for taking out the transfer object from the storage section so as to have the grasping part move in a direction for grasping the transfer object; and
    the member fixed to the robot hand supporting arm for contacting the grasping part is an eccentric member positioned eccentrically away from the turning center of the robot hand;
    the grasping part comprises a cylindrical cam part including a cam surface for contacting the eccentric member wherein at least a portion of the cam surface extends linearly and at an angle to the grasping and evacuating directions of the grasping part;
    the eccentric member comprises a cylindrical part whose cylindrical surface is essentially adapted to contact the cam surface, so as to enable the grasping part to move smoothly along a sine curve; and
    the grasping part starts grasping the transfer object with a biasing force of the biasing member at the time of one of constant-speed operation and deceleration in the expanding/folding motion of the multi-joint arm section for taking out the transfer object from the storage section.

2. The industrial robot according to claim 1:
    wherein the grasping part grasps the transfer object with the biasing force of the biasing member before starting operation of bringing the transfer object into the storage section;
    the eccentric member moves in comparison with the grasping part according to the expanding/folding motion of the multi-joint arm section for bringing the transfer object into the storage section so as to have the grasping part move in a direction for evacuating from the transfer object; and
    the grasping part furthermore starts evacuating from the transfer object at the time of one of acceleration and constant-speed operation in the expanding/folding motion of the multi-joint arm section for bringing the transfer object into the storage section.

3. The industrial robot according to claim 1:
    wherein the grasping part is placed at a root side of the robot hand, which is a side of the robot hand supporting arm; and
    the robot hand comprises contacting sections, which contact edges of the transfer object, at a top side of the robot hand.

4. The industrial robot according to claim 1:
    wherein the grasping part comprises a rotatable roller that contacts the transfer object.

5. The industrial robot according to claim 1:
    wherein the grasping part moves linearly in directions of grasping the transfer object and evacuating from the transfer object.

6. The industrial robot according to claim 5:
    wherein the grasping part comprises at least two shafts being guided linearly in the directions of grasping the transfer object and evacuating from the transfer object.

7. A method for taking out a transfer object from a storage section where the transfer object is stored and bringing the transfer object into the storage section by means of an industrial robot, which comprises a robot hand for mounting the transfer object, a multi-joint arm section having at least two arms including a robot hand supporting arm for supporting the robot hand to be rotatable at a top side, the multi-joint arm section expanding/folding at the time of taking out and bringing in the transfer object from/to the storage section, and a main section for supporting the multi-joint arm section to be rotatable, wherein the robot hand comprises a grasping part for contacting and grasping the transfer object, and a biasing member for biasing the grasping part in a direction for grasping the transfer object, and wherein the robot hand supporting arm comprises an eccentric member fixed to the robot hand supporting arm at a position being eccentric from a turning center of the robot hand in relation to the hand supporting arm, and adapted to contact the grasping part so as to evacuate the grasping part from the transfer object before starting operation of taking out the transfer object from the storage section, and further adapted to move in comparison with the grasping part according to the expanding/folding motion of the multi-joint arm section for taking out the transfer object from the storage section so as to have the grasping part move in a direction for grasping the transfer object (2); the method comprising:

grasping the transfer object with the grasping part with a biasing force of the biasing member at the time of one of constant-speed operation and deceleration in the expanding/folding motion of the multi-joint arm section to take the transfer objection out from the storage section; and grasping the transfer object with the biasing force of the biasing member before starting operation of bringing the transfer object into the storage section to bring the transfer object into the storage section, wherein the eccentric member moves in comparison with the grasping part according to the expanding/folding motion of the multi-joint arm section so as to have the grasping part move in a direction for evacuating from the transfer object, and the grasping part starts evacuating from the transfer object at the time of one of acceleration and constant-speed operation in the expanding/folding motion of the multi-joint arm section.

* * * * *